(12) United States Patent
Mizubata

(10) Patent No.: US 8,832,924 B2
(45) Date of Patent: Sep. 16, 2014

(54) SUBSTRATE PROCESSING APPARATUS, SUBSTRATE HOLDING APPARATUS, AND METHOD OF HOLDING SUBSTRATE

(75) Inventor: Minoru Mizubata, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 138 days.

(21) Appl. No.: 13/484,431

(22) Filed: May 31, 2012

(65) Prior Publication Data

US 2013/0025114 A1 Jan. 31, 2013

(30) Foreign Application Priority Data

Jul. 29, 2011 (JP) ................................. 2011-167005

(51) Int. Cl.
*B23Q 7/00* (2006.01)
*B25B 11/00* (2006.01)
*H01L 21/683* (2006.01)

(52) U.S. Cl.
CPC ................................. *H01L 21/6838* (2013.01)
USPC .............................................. 29/559; 269/21

(58) Field of Classification Search
CPC ............ H01L 21/6838; H01L 21/6875; B25B 11/005; B32B 38/1858; B24B 41/068; B24B 37/27; B23Q 3/088
USPC ................ 29/559, 743, 281.4, 281.6; 269/21; 294/188; 414/737
See application file for complete search history.

(56) References Cited

U.S. PATENT DOCUMENTS

| | | | |
|---|---|---|---|
| 6,022,417 A | 2/2000 | Sumnitsch | |
| 7,063,499 B2 | 6/2006 | Miyamoto | 414/744.8 |
| 7,360,322 B2 | 4/2008 | Iwasaka et al. | 34/576 |
| 2002/0036373 A1* | 3/2002 | Kosakai | 269/21 |
| 2007/0128888 A1 | 6/2007 | Goto et al. | |
| 2008/0267741 A1 | 10/2008 | Nagasaka et al. | 414/217 |

FOREIGN PATENT DOCUMENTS

| | | |
|---|---|---|
| JP | 04-186818 | 7/1992 |
| JP | 5-150175 | 6/1993 |
| JP | H09-002682 | 1/1997 |
| JP | H 09-66429 A | 3/1997 |
| JP | 10-041376 | 2/1998 |

(Continued)

OTHER PUBLICATIONS

Korean Office Action dated Jul. 24 2013 in counterpart Korean Patent Application No. 10-2012-0029283 (Dispatch No. 9-5-2013-050998382), Japanese translation thereof, and English translation based on the Japanese translation.

(Continued)

*Primary Examiner* — John C Hong
(74) *Attorney, Agent, or Firm* — Ostrolenk Faber LLP

(57) ABSTRACT

A drawing apparatus which performs a drawing process on a substrate includes a holding plate having a holding surface configured to be opposed a back surface of the substrate, a vacuum suction port formed in the holding surface and configured to attract the substrate to the holding surface by vacuum suction, and a plurality of Bernoulli suction ports formed in the holding surface and configured to attract the substrate to the holding surface by Bernoulli suction. The holding surface includes a circular region disposed concentrically with the center of the holding surface, and an annular region disposed concentrically with the circular region. At least one of the Bernoulli suction ports is disposed in the circular region, and at least one of the Bernoulli suction ports is disposed in the annular region.

25 Claims, 15 Drawing Sheets

(56) References Cited

FOREIGN PATENT DOCUMENTS

| JP | 2002-064130 | 2/2002 |
|---|---|---|
| JP | 2004-193195 | 7/2004 |
| JP | 2005-019637 | 1/2005 |
| JP | 2005-142462 | 6/2005 |
| JP | 2006-080289 | 3/2006 |
| JP | 2007-158075 | 6/2007 |
| JP | 2008-270626 | 11/2008 |
| JP | 2009-028863 | 2/2009 |
| JP | 2010-052051 | 3/2010 |
| KR | 10-2009-0121464 | 11/2009 |

OTHER PUBLICATIONS

Office Action issued by Taiwanese Patent Office on Apr. 8, 2014 in connection with corresponding Taiwanese Patent Application No. 101108719 with Japanese and English Translation thereof.

* cited by examiner

F I G. 5
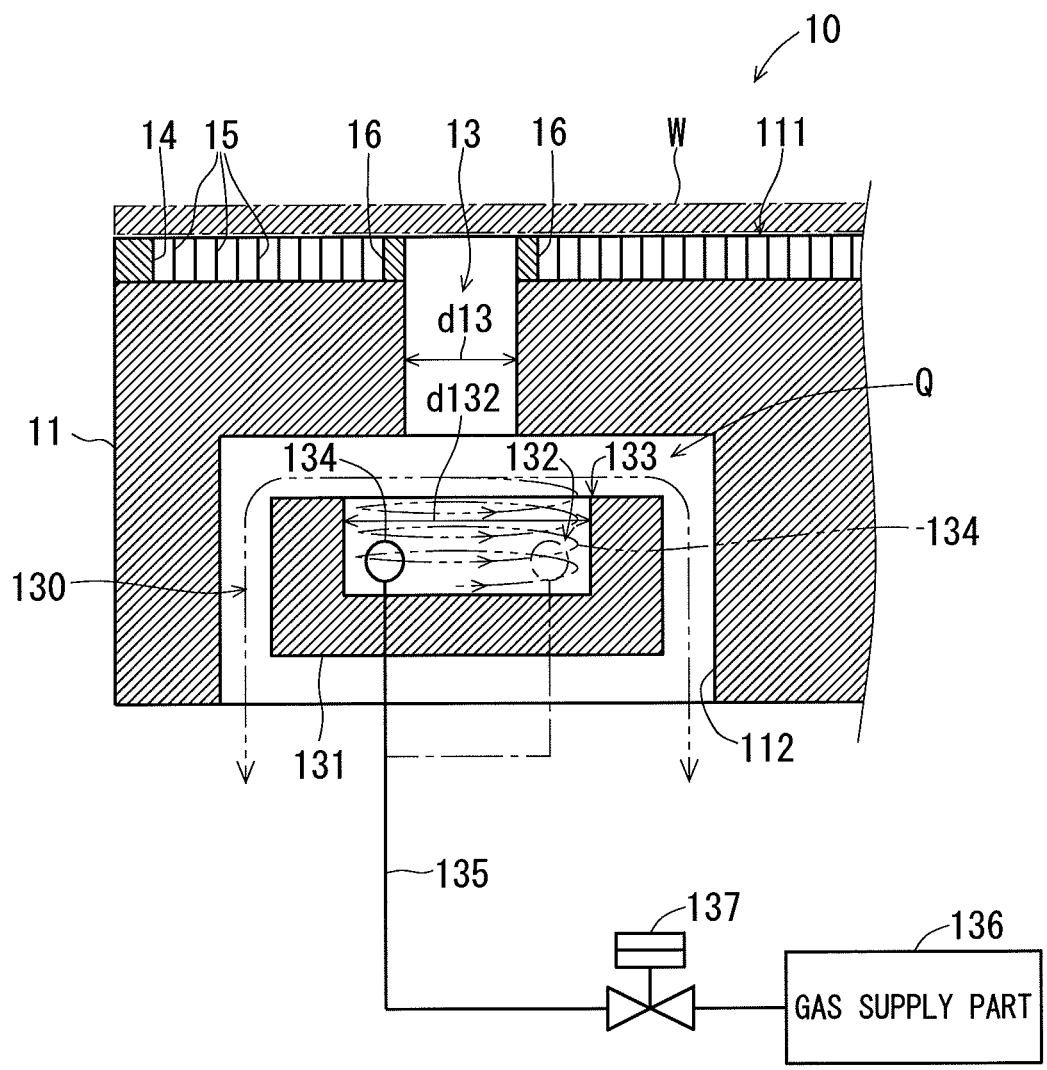

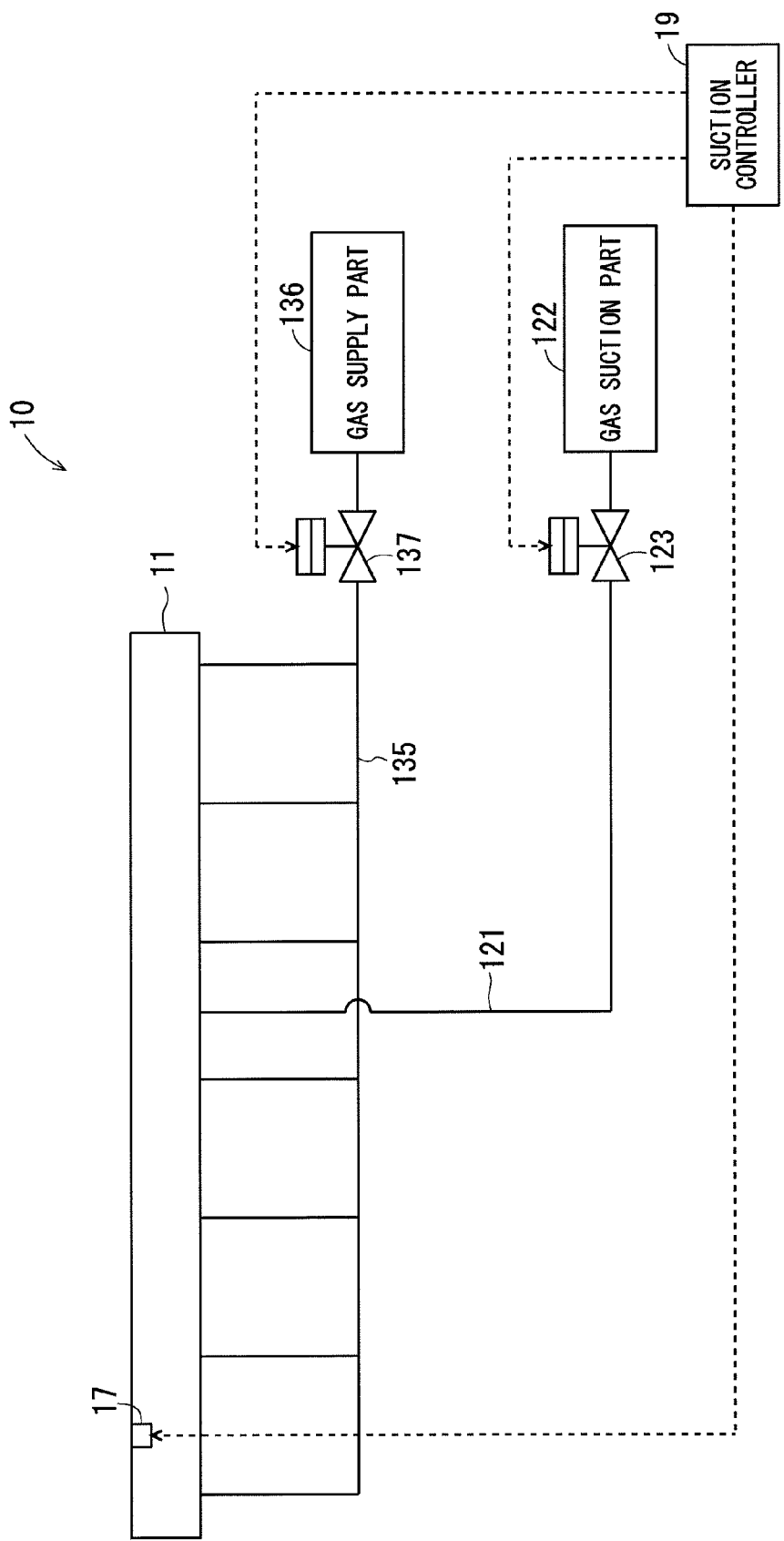
F I G . 6

F I G. 8
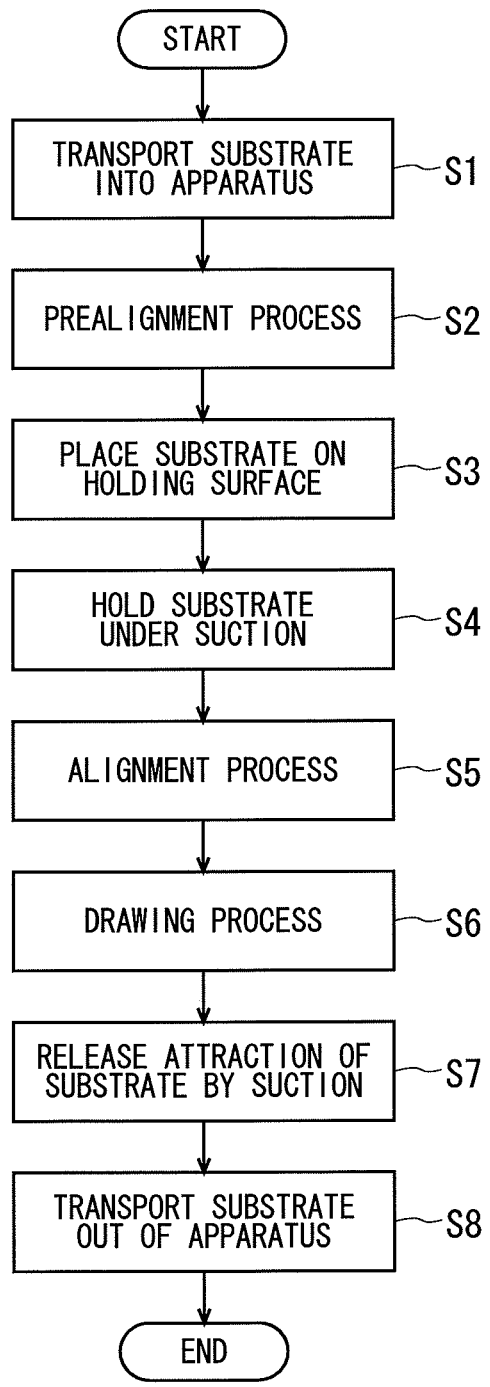

F I G. 1 0
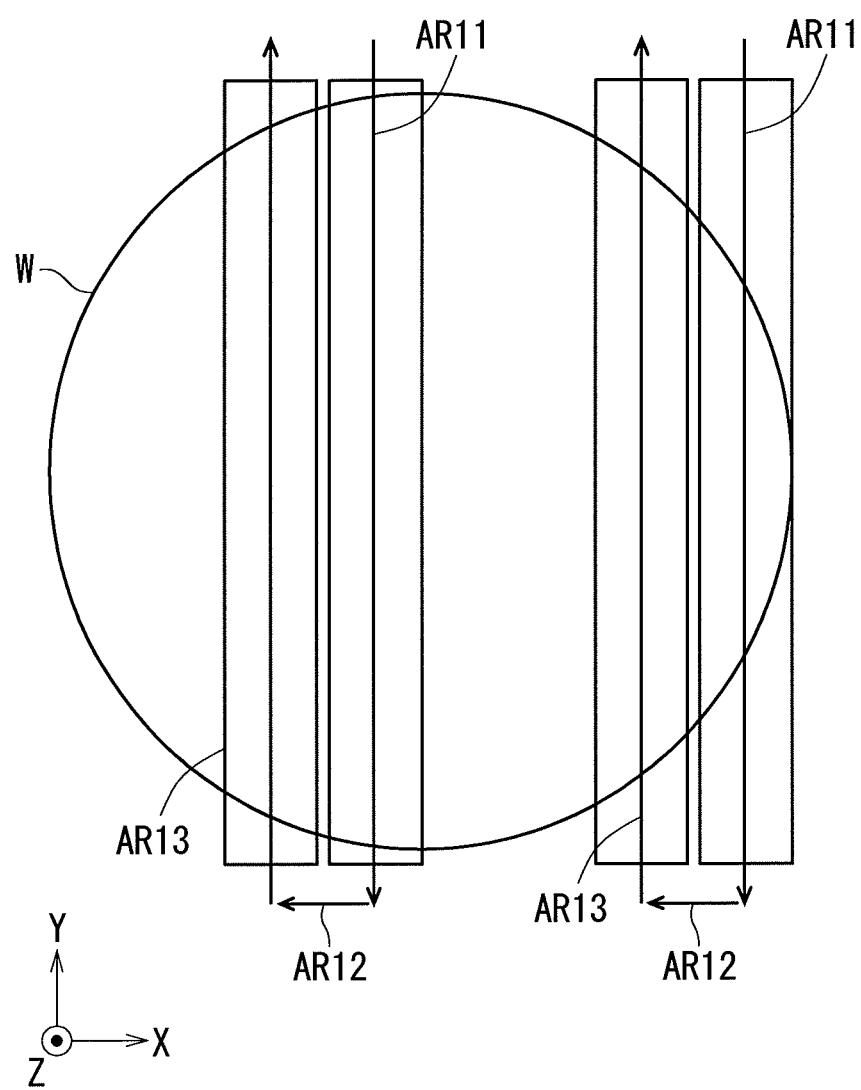

SUBSTRATE PROCESSING APPARATUS, SUBSTRATE HOLDING APPARATUS, AND METHOD OF HOLDING SUBSTRATE

BACKGROUND OF THE INVENTION

1. Field of the Invention

The present invention relates to a technique for holding various substrates including a semiconductor substrate, a printed circuit board, a substrate for a color filter, a glass substrate for a flat panel display provided in a liquid crystal display device and a plasma display device, a substrate for an optical disk, a solar cell panel and the like (hereinafter referred to simply as "substrates").

2. Description of the Background Art

The technique of holding a substrate is essential for various substrate processing apparatuses (as disclosed in, for example, Japanese Patent Application Laid-Open No. 5-150175 (1993)) which perform various processes on a substrate (for example, the process of irradiating a photosensitive material formed on a substrate with light, the process of applying various coating solutions onto a substrate, and the like) and for substrate transport apparatuses which transport a substrate.

In regard to this technique, for example, Japanese Patent Application Laid-Open Nos. 2008-270626 and 2005-19637 each disclose a structure which uses vacuum suction nozzles to hold the lower surface of a substrate under suction. Also, for example, Japanese Patent Application Laid-Open Nos. 2009-28863, 2005-142462, 2002-64130 and 2010-52051 each disclose a structure which uses Bernoulli nozzles based on Bernoulli's principle (or nozzles which eject a gas from holes formed in a holding surface to attract a substrate by suction using the Bernoulli effect) to hold a substrate under suction. Also, for example, Japanese Patent Application Laid-Open No. 2004-193195 discloses a structure which uses vacuum suction nozzles to fix a substrate so as to prevent the substrate from moving while using Bernoulli nozzles to lift the substrate. Also, for example, Japanese Patent Application Laid-Open No. 2006-80289 discloses a structure which uses both Bernoulli nozzles and vacuum suction nozzles to hold a substrate under suction.

In a drawing apparatus and the like which directs light onto a photosensitive material formed on a substrate to form a pattern of a circuit and the like on the substrate, drawing accuracy is lowered if the substrate is out of position relative to a holding surface during processing. It is hence necessary to securely hold the substrate placed on the holding surface so that the substrate is prevented from being out of position.

A substrate placed on a holding surface is not necessarily flat in shape. For example, when a hand of a transport apparatus with a substrate placed on the holding surface thereof supports a portion of the substrate near the center thereof, there is a possibility that the substrate placed on the holding surface is warped in a convex form. When the hand of the transport apparatus supports an outer edge of the substrate, there is a possibility that the substrate placed on the holding surface is warped in a concave form. In recent years in which substrates become thinner, the substrates have been much prone to be warped. Thus, there is a high possibility that the substrates placed on the holding surface are warped.

In the structures configured to hold the substrate under suction on the holding surface by forming a negative pressure between the substrate and the holding surface as disclosed in the aforementioned cited references, it is very difficult to securely hold a warped substrate. This is because the negative pressure is relieved through a gap which is created between part of the back surface of the substrate and the holding surface if the substrate placed on the holding surface is warped. Unless a sufficient suction pressure is formed between the holding surface and the back surface of the substrate, suction failure occurs to increase the possibility that the substrate is out of position relative to the holding surface. On the other hand, when an attempt is made to securely hold the substrate under suction without the occurrence of such suction failure, it is necessary that a very large sucking force is exerted on the substrate. To this end, there arises a need to provide, for example, a large-sized vacuum pump and a large-scale piping system, which inevitably results in the increase in the size and costs of the apparatus.

SUMMARY OF THE INVENTION

The present invention is intended for a substrate processing apparatus for performing a predetermined process on a substrate. According to an aspect of the present invention, the substrate processing apparatus comprises: a holding plate having a holding surface configured to be opposed a back surface of a substrate; at least one vacuum suction port formed in the holding surface and configured to attract the substrate to the holding surface by vacuum suction; and a plurality of Bernoulli suction ports formed in the holding surface and configured to attract the substrate to the holding surface by Bernoulli suction, the holding surface including a circular region disposed concentrically with the center of the holding surface, and an annular region disposed concentrically with the circular region, at least one of the Bernoulli suction ports being disposed in the circular region, at least one of the Bernoulli suction ports being disposed in the annular region.

According to this aspect, at least one of the Bernoulli suction ports is disposed in each of the circular region and the annular region defined on the holding surface. Whether the substrate is warped in a convex form or in a concave form, the suction through the Bernoulli suction ports corrects the warpage to flatten the substrate. Thus, the substrate processing apparatus is capable of securely holding the substrate under suction with a simple configuration even when the substrate is warped.

Preferably, the substrate processing apparatus according to another aspect of the present invention further comprises: an embankment provided upright along the outer edge of the holding surface; and a plurality of protrusions provided upright in a region of the holding surface surrounded by the embankment, the tops of the respective protrusions being flush with the top of the embankment.

According to this aspect, the substrate is held under suction while being in contact with the top of the embankment and the tops of the protrusions. In such a configuration, the substrate is held on the holding surface under suction, with the back surface of the substrate lying in a position spaced a distance corresponding to the height of the embankment apart from the holding surface. Thus, there is no danger that a mark is made on the back surface of the substrate by the suction through the vacuum suction port.

Preferably, in the substrate processing apparatus according to another aspect of the present invention, at least two of the Bernoulli suction ports are disposed in the annular region, and the at least two Bernoulli suction ports disposed in the annular region are arranged in a circumferential direction of the annular region.

According to this aspect, at least two Bernoulli suction ports are arranged in a circumferential direction of the annular region of the holding surface. In such a configuration, even when the substrate is warped in a concave form, the suction pressure formed in the Bernoulli suction ports disposed in the annular region corrects the warpage to flatten the substrate, whereby the substrate is securely held under suction.

Preferably, the substrate processing apparatus according to another aspect of the present invention further comprises: an embankment provided upright so as to surround each of the circular region and a plurality of arcuate regions defined by dividing the annular region in a circumferential direction of the annular region; and a plurality of protrusions provided upright in each of the regions of the holding surface surrounded by the embankment, the tops of the respective protrusions being flush with the top of the embankment, the at least one vacuum suction port including a plurality of vacuum suction ports, at least one of the vacuum suction ports and at least one of the Bernoulli suction ports being disposed in each of the arcuate regions, at least one of the vacuum suction ports and at least one of the Bernoulli suction ports being disposed in the circular region.

According to this aspect, at least one of the vacuum suction ports and at least one of the Bernoulli suction ports are disposed in each of a plurality of partial regions (the arcuate regions and the circular region) defined within the holding surface, and the embankment is formed so as to surround each of the partial regions. In such a configuration, enclosed spaces are defined between the respective partial regions and the back surface of the substrate, so that the back surface of the substrate is held under suction independently by the partial regions. This corrects the warpage to flatten the substrate efficiently without waste, so that the substrate is securely held under suction. Also in this configuration, the substrate is held on the holding surface under suction, with the back surface of the substrate lying in a position spaced a distance corresponding to the height of the embankment apart from the holding surface. Thus, there is no danger that a mark is made on the back surface of the substrate by the suction through the vacuum suction ports.

Preferably, in the substrate processing apparatus according to another aspect of the present invention, the arcuate regions are equal in area to each other.

According to this aspect, the arcuate regions are equal in area to each other. In such a configuration, the enclosed spaces defined between the respective arcuate regions and the back surface of the substrate are equal in volume to each other, so that equal sucking forces are exerted on the substrate in the respective arcuate regions.

Preferably, the substrate processing apparatus according to another aspect of the present invention further comprises a pressure sensor for detecting the pressure on the holding surface, wherein suction through the at least one vacuum suction port is started after the substrate is placed on the holding surface, and wherein suction through the Bernoulli suction ports is started, when the pressure sensor does not detect that the suction pressure on the holding surface becomes a lower pressure than a predetermined value after a lapse of a determined time period since the start of the suction through the at least one vacuum suction port.

According to this aspect, the suction through the Bernoulli suction ports is started, when the suction pressure on the holding surface does not become a lower pressure than the predetermined value even after the start of the suction through the at least one vacuum suction port. In such a configuration, the suction through the Bernoulli suction ports is not performed, for example, when the substrate placed on the holding surface is originally unwarped and flat in shape. This suppresses wasteful consumption of air.

Preferably, in the substrate processing apparatus according to another aspect of the present invention, the suction through the Bernoulli suction ports is stopped, when the pressure sensor detects that the suction pressure on the holding surface becomes a lower pressure than the predetermined value after the start of the suction through the Bernoulli suction ports.

According to this aspect, the suction through the Bernoulli suction ports is stopped, when the suction pressure on the holding surface becomes a lower pressure than the predetermined value after the start of the suction through the Bernoulli suction ports. In other words, after the substrate which is warped is flattened by the suction through the Bernoulli suction ports and is hence appropriately held under suction, the substrate is held under suction only by the suction through the vacuum suction port. In such a configuration, the suction through the Bernoulli suction ports is suppressed to a required minimum level. This suppresses wasteful consumption of air.

Preferably, the substrate processing apparatus according to another aspect of the present invention further comprises: a recess provided in the back surface of the holding plate and communicating with each of the Bernoulli suction ports at the bottom surface as seen in the depth direction; and a Bernoulli suction unit disposed inside the recesses, the Bernoulli suction unit including a body part having a cylindrical recessed space formed therein, the body part being fixedly supported inside the recess, with a slight gap produced between the body part and the bottom and wall surfaces of the recess as seen in the depth direction, and an ejection nozzle for ejecting a gas into the cylindrical recessed space to produce a swirl flow in the cylindrical recessed space.

According to this aspect, the body part of the Bernoulli suction unit is fixedly supported inside the recess, with a slight gap produced between the body part and the bottom and wall surfaces of the recess as seen in the depth direction. The gas flowing over the cylindrical recessed space flows along the gap around the body part, and is discharged toward the back surface of the holding plate. In such a configuration, even when each of the Bernoulli suction ports is blocked by the back surface of the substrate, the suction pressure in each of the Bernoulli suction ports is continuously maintained.

Preferably, in the substrate processing apparatus according to another aspect of the present invention, each of the Bernoulli suction ports has a diameter less than the diameter of the cylindrical recessed space.

According to this aspect, the diameter of the Bernoulli suction ports is less than that of the cylindrical recessed space. In such a configuration, there is no danger that the suction through the Bernoulli suction ports deteriorates the flatness of the substrate because an area on the back surface of the substrate on which the suction pressure acts becomes smaller.

The present invention is also intended for a substrate holding apparatus for holding a substrate. The present invention is also intended for a method of holding a substrate.

It is therefore an object of the present invention to provide a technique capable of securely holding a substrate with a simple configuration even when the substrate is warped.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a partial sectional view of the substrate holding part taken at a position where a Bernoulli suction port is formed;

FIG. 6 schematically illustrates a piping system included in the substrate holding part according to the first preferred embodiment;

FIG. 8 is a flow diagram showing a procedure for the processes performed on a substrate in the drawing apparatus;

FIG. 10 is a view for illustrating a drawing process;

DESCRIPTION OF THE PREFERRED EMBODIMENTS

Preferred embodiments according to the present invention will now be described with reference to the accompanying drawings. The preferred embodiments to be described below are merely an example embodying the present invention, and are not intended to limit the technical scope of the invention.

<<First Preferred Embodiment>>

<1. Apparatus Configuration>

Figure 1:
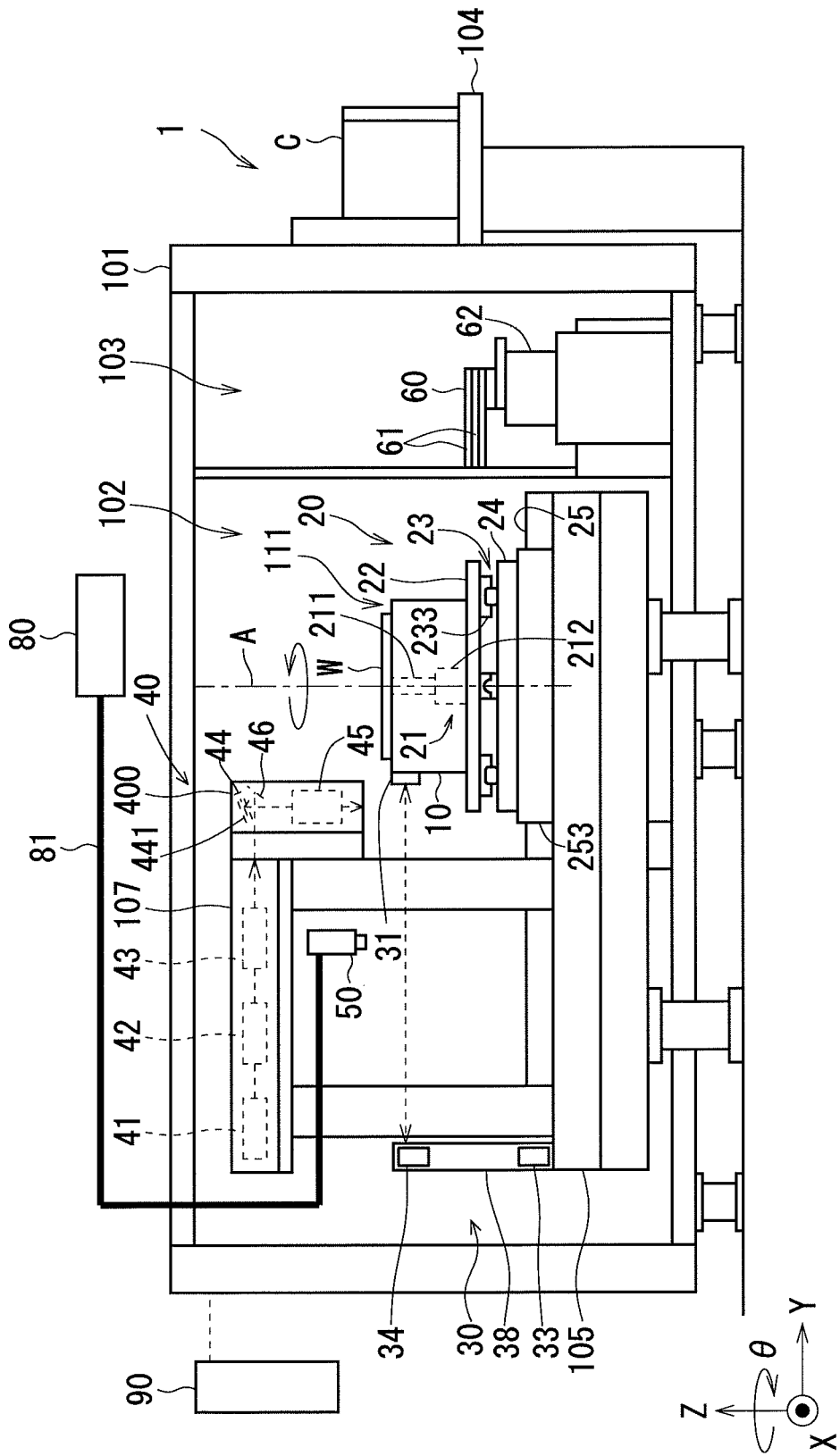
FIG. 1 is a side view of a drawing apparatus.
Figure 2:
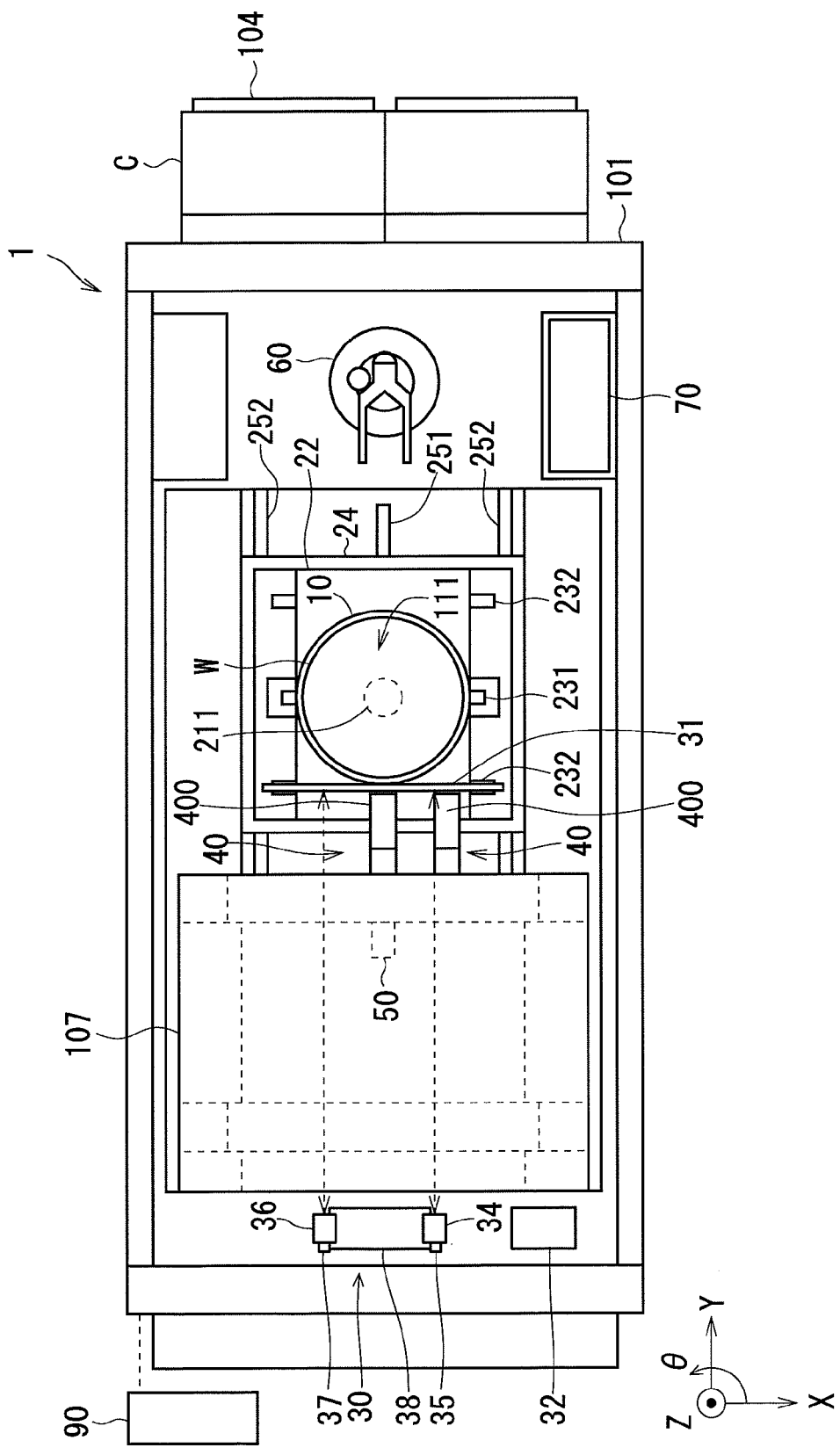
FIG. 2 is a plan view of the drawing apparatus.

The configuration of a drawing apparatus 1 according to a first preferred embodiment of the present invention will be described with reference to FIGS. 1 and 2. FIG. 1 is a side view schematically showing the configuration of the drawing apparatus 1. FIG. 2 is a plan view schematically showing the configuration of the drawing apparatus 1.

The drawing apparatus 1 is an apparatus for directing light onto an upper surface of a substrate W with a layer of a photosensitive material such as a resist formed thereon to expose the layer in a pattern to the light. The substrate W may be any one selected from among various substrates including a semiconductor substrate, a printed circuit board, a substrate for a color filter, a glass substrate for a flat panel display provided in a liquid crystal display device and a plasma display device, a substrate for an optical disk, a solar cell panel and the like. In FIGS. 1 and 2, a circular semiconductor substrate is shown.

The drawing apparatus 1 is configured such that various components are disposed in a body interior defined by mounting cover panels (not shown) to a ceiling surface and a peripheral surface of a framework constituted by a body frame 101 and on a body exterior which is the outside of the body frame 101.

The body interior of the drawing apparatus 1 is separated into a processing region 102 and a transfer region 103. A substrate holding part 10, a stage driving mechanism 20, a measuring part 30, two optical units 40, and an imaging unit 50 are mainly disposed in the processing region 102. A transport device 60 for transporting a substrate W into and out of the processing region 102, and a prealignment part 70 are disposed in the transfer region 103.

A lighting unit 80 for supplying illumination light to the imaging unit 50 is disposed on the body exterior of the drawing apparatus 1. A cassette table 104 for placing a cassette C thereon is also disposed in a position lying on the body exterior of the drawing apparatus 1 and adjacent to the transfer region 103. The transport device 60 disposed in the transfer region 103 takes an unprocessed substrate W out of a cassette C placed on the cassette table 104 to transport the unprocessed substrate W into the processing region 102, and transports a processed substrate W out of the processing region 102 to store the processed substrate W into a cassette C. The transfer of a cassette C to and from the cassette table 104 is performed by an external transport device (not shown).

Also disposed in the drawing apparatus 1 is a controller 90 electrically connected to the parts of the drawing apparatus 1 and for controlling the operations of the respective parts.

The configuration of the parts of the drawing apparatus 1 will be described below.

<1-1. Substrate Holding Part 10>

Figure 3:
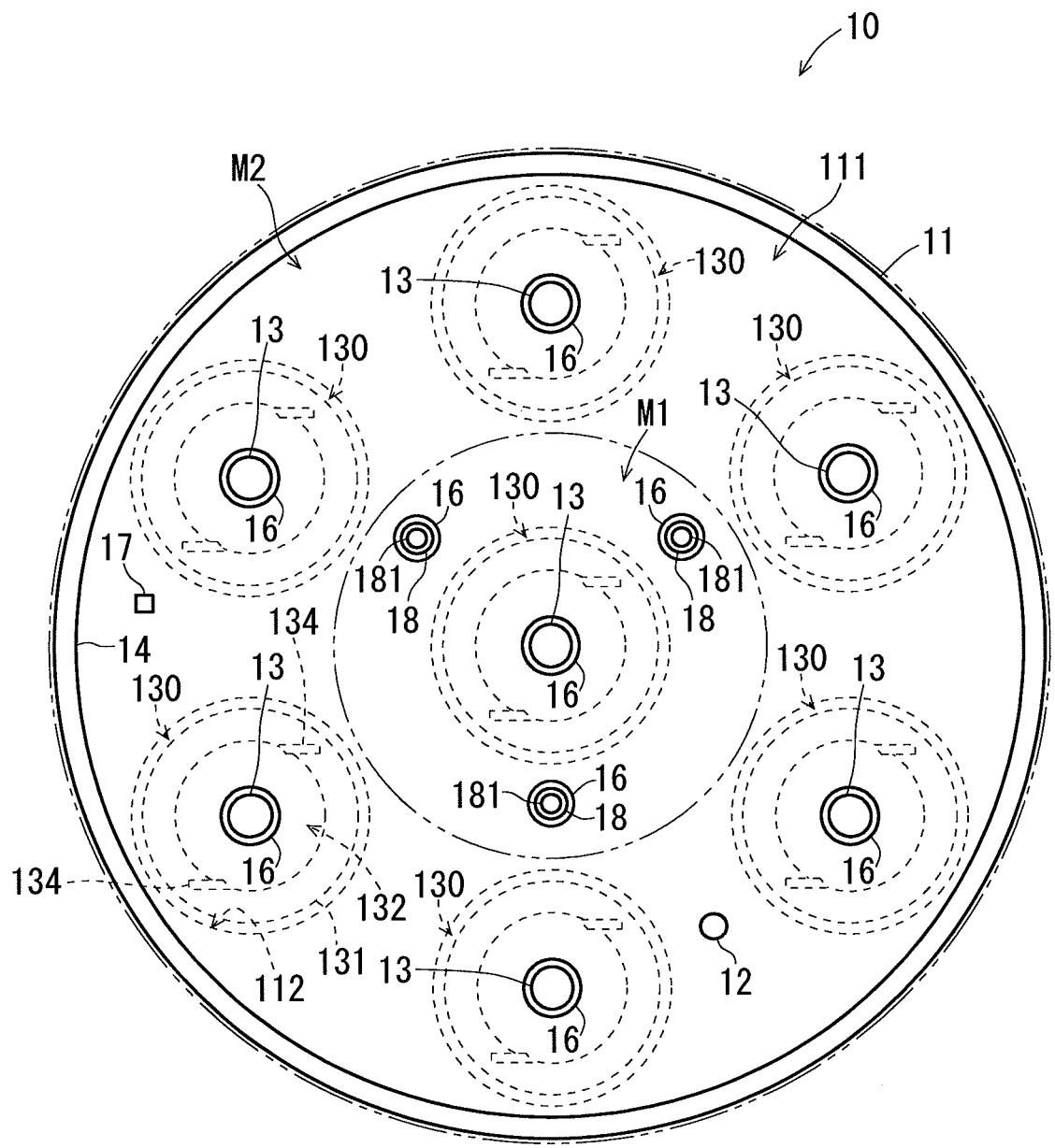
FIG. 3 is a plan view of a substrate holding part according to a first preferred embodiment of the present invention.
Figure 4:
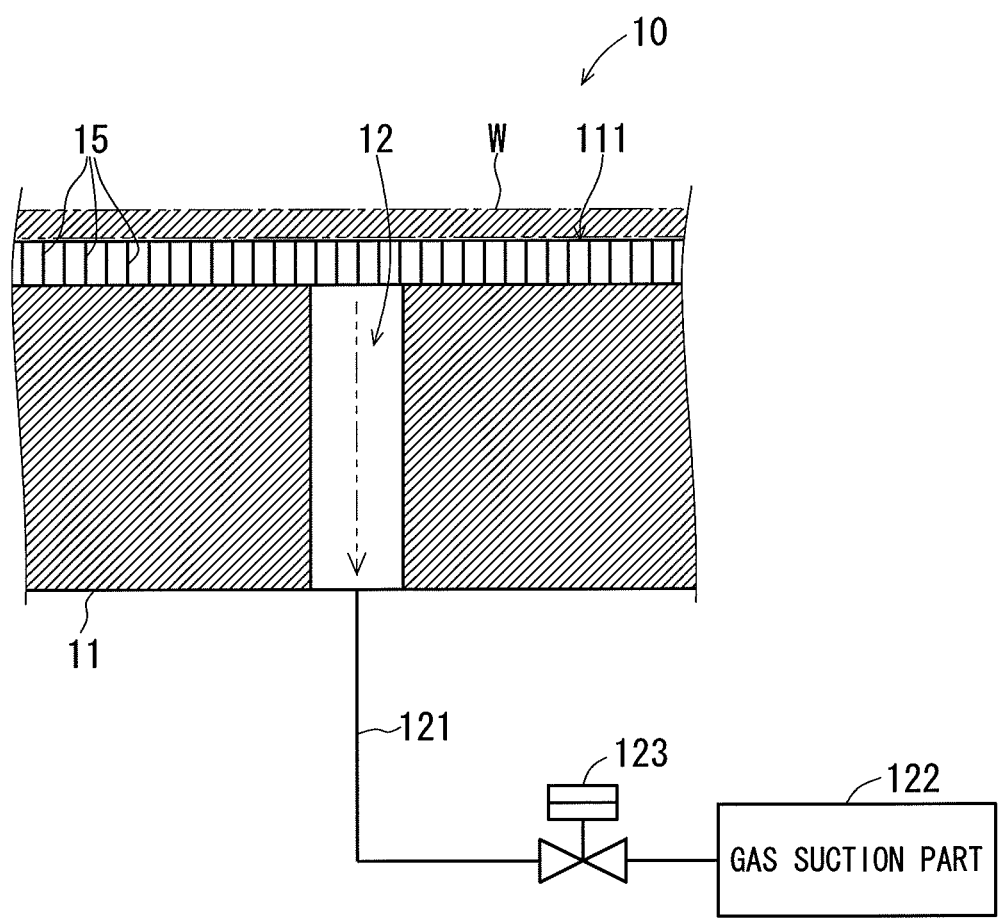
FIG. 4 is a partial sectional view of the substrate holding part taken at a position where a vacuum suction port is formed.

The substrate holding part 10 is an apparatus for holding a substrate W in a horizontal position under suction. The configuration of the substrate holding part 10 will be described with reference to FIGS. 3 to 6 in addition to FIGS. 1 and 2. FIG. 3 is a plan view of the substrate holding part 10. FIG. 4 is a partial sectional view of the substrate holding part 10 taken at a position where a vacuum suction port 12 is formed. FIG. 5 is a partial sectional view of the substrate holding part 10 taken at a position where a Bernoulli suction port 13 is formed. FIG. 6 schematically illustrates a piping system included in the substrate holding part 10.

The substrate holding part 10 includes a holding plate 11 having a planar outside shape. The upper surface of the holding plate 11 serves as a holding surface 111 configured to be opposed to the back surface of a substrate W. The holding surface 111 is formed to have a flatness sufficiently small in value (for example, approximately 2 µm or less) as compared with the depth of focus of the optical units 40. The holding surface 111 is sized to cover at least an exposure region of a substrate W. It should be noted that the substrate W shall be circular in shape, and the holding surface 111 is also circular in shape as seen in plan view according to this preferred embodiment.

<Suction Ports 12 and 13>

The holding surface 111 includes suction ports 12 and 13 formed therein. Of these suction ports 12 and 13, the single suction port 12 is a suction port (referred to hereinafter as a vacuum suction port) 12 which attracts a substrate W to the holding surface 111 by vacuum suction, and the remaining suction ports 13 are suction ports (referred to hereinafter as Bernoulli suction ports) 13 which attract a substrate W to the holding surface 111 by Bernoulli suction. In the illustration, seven Bernoulli suction ports 13 are shown as formed.

The arrangement of the Bernoulli suction ports 13 will be described. The holding surface 111 has two specified regions: a circular region M1 disposed concentrically with the center (geometric center) of the holding surface 111, and an annular region M2 disposed concentrically with the circular region M1. The inside diameter of the annular region M2 is equal to the outside diameter of the circular region M1. At least one of the Bernoulli suction ports 13 is disposed in each of the circular region M1 and the annular region M2. It is however preferable that at least two of the Bernoulli suction ports 13 are disposed in the annular region M2. When disposed in the annular region M2, the at least two of the Bernoulli suction ports 13 are preferably arranged in a circumferential direction of the annular region M2.

In this preferred embodiment, one of the Bernoulli suction ports 13 is disposed at the center of the circular region M1, and six of the Bernoulli suction ports 13 are disposed in the annular region M2 in equally spaced relation in the circumferential direction of the annular region M2.

Next, the vacuum suction port 12 will be specifically described. The vacuum suction port 12 is connected through a pipe 121 to a gas suction part (for example, a vacuum pump) 122 for sucking in a gas. An on-off valve (for example, a solenoid valve) 123 is interposed in the pipe 121. When the gas suction part 122 is put in operation and the on-off valve 123 is opened, a negative pressure (suction pressure) is produced in the vacuum suction port 12 through the pipe 121.

Next, the Bernoulli suction ports 13 will be specifically described. A recess 112 is provided in a position lying in the back surface of the holding plate 11 and corresponding to each of the Bernoulli suction ports 13. The recess 112 opens toward the back surface of the holding plate 11, and is in communication with a corresponding one of the Bernoulli suction ports 13 at the bottom surface as seen in the depth direction.

A body part 131 of each Bernoulli suction unit 130 is disposed inside the recess 112. The recess 112 is next larger in size than the body part 131, so that the body part 131 is fixedly supported inside the recess 112, with a slight gap (for example, a gap of the order of hundreds of micrometers) Q produced between the end surface 133 and side surface of the body part 131 and the bottom and wall surfaces of the recess 112 as seen in the depth direction.

The end surface 133 of the body part 131 opposed to the bottom surface of the recess 112 as seen in the depth direction is made flat. The end surface 133 has a cylindrical recessed space 132 formed therein. It should be noted that the body part 131 disposed in the recess 112 assumes a position such that the central portion of the cylindrical recessed space 132 is opposed to each of the Bernoulli suction ports 13. Each of the Bernoulli suction ports 13 has a diameter d13 less than the diameter d132 of the cylindrical recessed space 132.

The Bernoulli suction unit 130 further includes a pair of ejection nozzles 134 opening along the inner peripheral wall of the cylindrical recessed space 132. The ejection nozzles 134 are connected through a pipe 135 to a gas supply part (for example, a compressor) 136 for supplying a gas such as compressed air. An on-off valve (for example, a solenoid valve) 137 and a filter (not shown) are interposed in the pipe 135. When the gas supply part 136 is put in operation and the on-off valve 137 is opened, a compressed gas is ejected from the ejection nozzles 134 through the pipe 135. The gas ejected from the pair of ejection nozzles 134 along the inner peripheral wall of the cylindrical recessed space 132 flows along the inner peripheral wall of the cylindrical recessed space 132, and produces a strong swirl flow to flow outwardly from an open end of the cylindrical recessed space 132. At this time, a negative pressure is produced in a central portion of the swirl flow (i.e., a central portion of the cylindrical recessed space 132) in accordance with the Bernoulli theorem, whereby a negative pressure (suction pressure) is formed in each of the Bernoulli suction ports 13. The gas flowing over the cylindrical recessed space 132 flows along the gap Q defined between the body part 131 and the recess 112, and is discharged toward the back surface of the holding plate 11.

<Embankment 14, Protrusions 15 and Annular Protrusions 16>

An embankment 14 is provided upright along the outer edge of the holding surface 111. Multiple protrusions 15 are disposed upright evenly in the entire region of the holding surface 111 surrounded by the embankment 14 (FIGS. 4 and 5). Annular protrusions 16 are provided upright along the outer edges of the respective Bernoulli suction ports 13 and the outer edges of respective pin holes 18 to be described later. The protrusions 15 are not shown in FIG. 3.

The top of the embankment 14, the tops of the protrusions 15 and the tops of the annular protrusions 16 are flush with each other, and the plane in which these tops are disposed is adapted to have a flatness sufficiently small in value (for example, approximately 2 μm or less) as compared with the depth of focus of the optical units 40. When a flat substrate W is placed on the holding surface 111, the back surface of the substrate W comes in contact with the entire area of the top of the embankment 14, the tops of all of the protrusions 15 and the tops of all of the annular protrusions 16, so that an enclosed space is defined by the embankment 14, the region of the holding surface 111 surrounded by the embankment 14, and the back surface of the substrate W. In this state, when a negative pressure is formed in the vacuum suction port 12 defined in the holding surface 111, the pressure in the enclosed space is reduced, so that the substrate W (specifically, at least part of the substrate W including the exposure region) in a flat condition is held on the holding surface 111 under suction, with the back surface of the substrate W lying in a position spaced a distance corresponding to the height of the embankment 14 apart from the holding surface 111.

<Pressure Sensor 17>

A pressure sensor 17 is disposed on the holding surface 111. The pressure sensor 17 detects the pressure on the holding surface 111.

<Pin Holes 18>

The substrate holding part 10 includes a plurality of lift pins 181 for moving the substrate W upwardly and downwardly relative to the holding surface 111. The holding surface 111 has the pin holes 18 which allow the respective lift pins 181 to pass therethrough. The lift pins 181 are connected to a lift pin driving mechanism (not shown), and are synchronously extendable out of and retractable into the holding surface 111 through the respective pin holes 18. For the transfer of the substrate W between the transport device 60 and the holding surface 111, the lift pins 181 are reciprocatingly moved between an upward position (or a protruding position) in which the tips of the respective lift pins 181 protrude from the holding surface 111 and a downward position (or a retracted position) in which the tips of the respective lift pins 181 are at or below the holding surface 111.

<Suction Controller 19>

Figure 7:
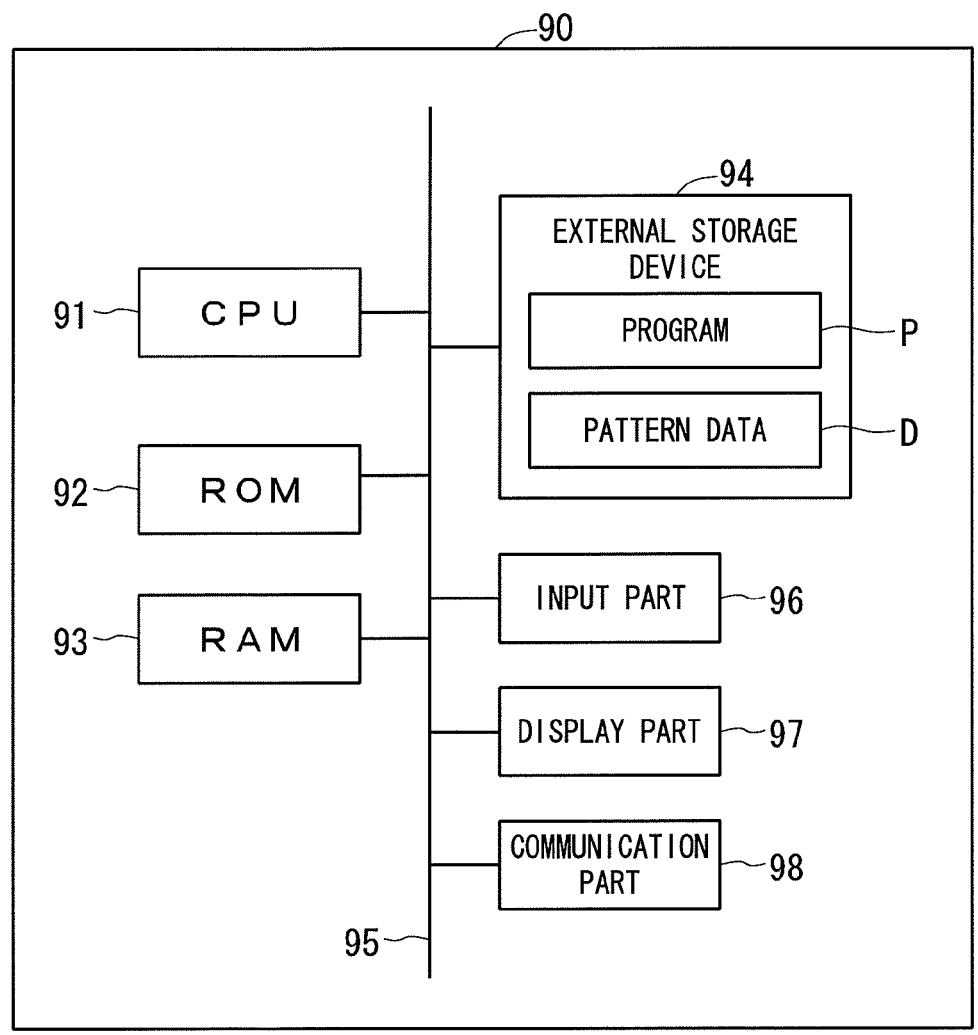
FIG. 7 is a block diagram showing a hardware configuration of a controller.

The substrate holding part 10 further includes a suction controller 19 for controlling the components of the substrate holding part 10. The suction controller 19 is implemented in the controller 90 to be described in detail later, for example, by a CPU 91 performing a predetermined computation process in accordance with a program P or by a purpose-built logic circuit and the like in the form of hardware (FIG. 7).

The suction controller 19 is electrically connected to the pressure sensor 17, and is configured to be able to acquire a detection signal from the pressure sensor 17. The suction controller 19 is also electrically connected to the on-off valve 123 and the on-off valve 137, and controls the opening and closing of the on-off valves 123 and 137 independently, based on the detection signal and the like provided from the pressure sensor 17. Specifically, the suction controller 19 controls the formation of the suction pressures in the suction ports (the vacuum suction port 12 and the Bernoulli suction ports 13) formed in the holding surface 111, based on the detection signal and the like provided from the pressure sensor 17. Such control will be described later in detail.

<1-2. Stage Driving Mechanism 20>

Referring again to FIGS. 1 and 2, the stage driving mechanism 20 is a mechanism for moving the substrate holding part 10 relative to a base 105. The stage driving mechanism 20 moves the substrate holding part 10 in a main scanning direction (in a Y-axis direction), a sub-scanning direction (in an X-axis direction), and a rotational direction (in a rotational direction about a Z-axis (in a θ-axis direction)). Specifically, the stage driving mechanism 20 includes a rotational mechanism 21 (FIG. 1) for rotating the substrate holding part 10. The stage driving mechanism 20 further includes a support plate 22 for supporting the substrate holding part 10 via the rotational mechanism 21, and a sub-scanning mechanism 23 for moving the support plate 22 in the sub-scanning direction. The stage driving mechanism 20 further includes a base plate 24 for supporting the support plate 22 via the sub-scanning mechanism 23, and a main scanning mechanism 25 for moving the base plate 24 in the main scanning direction.

As shown in FIG. 1, the rotational mechanism 21 rotates the substrate holding part 10 about a rotational axis A perpendicular to the holding surface 111 and passing through the center of the upper surface (the holding surface 111) of the substrate holding part 10. The rotational mechanism 21 may be configured to include, for example, a rotary shaft 211 having an upper end secured to the opposite surface of the holding surface 111 and extending along a vertical axis, and a driving part (for example, a rotary motor) 212 provided on a lower end of the rotary shaft 211 and for rotating the rotary shaft 211. In such a configuration, the driving part 212 rotates the rotary shaft 211, whereby the substrate holding part 10 rotates about the rotational axis A in a horizontal plane.

The sub-scanning mechanism 23 includes a linear motor 231 comprised of a moving element mounted to the lower surface of the support plate 22 and a stator laid on the upper surface of the base plate 24. Also, a pair of guide members 232 extending in the sub-scanning direction are laid on the base plate 24. A ball bearing 233 slidably movable along each of the guide members 232 is provided between each of the guide members 232 and the support plate 22. In other words, the support plate 22 is supported on the pair of guide members 232 via the ball bearings 233. In such a configuration, when the linear motor 231 is put in operation, the support plate 22 smoothly moves in the sub-scanning direction while being guided by the guide members 232.

The main scanning mechanism 25 includes a linear motor 251 comprised of a moving element mounted to the lower surface of the base plate 24 and a stator laid on the base 105 of the drawing apparatus 1. Also, a pair of guide members 252 extending in the main scanning direction are laid on the base 105. An air bearing 253 is provided between each of the guide members 252 and the base plate 24. Air is always supplied from a utility facility to the air bearings 253, and the base plate 24 is floatingly supported by the air bearings 253 in a non-contacting manner over the guide members 252. In such a configuration, when the linear motor 251 is put in operation, the base plate 24 smoothly moves in the main scanning direction without friction while being guided by the guide members 252.

<1-3. Measuring Part 30>

The measuring part 30 is a mechanism for measuring the position of the substrate holding part 10. The measuring part 30 is constructed by an interference-type laser length measuring machine which emits laser light from outside the substrate holding part 10 toward the substrate holding part 10 and receives the light reflected therefrom to measure the position (specifically, the Y-position as measured in the main scanning direction and the θ-direction as measured in the rotational direction) of the substrate holding part 10, based on interference between the reflected light and the emitted light.

The measuring part 30 may be configured to include, for example, a plane mirror 31 mounted to a side surface on the negative Y side of the substrate holding part 10 and having a reflective surface on the negative Y side perpendicular to the main scanning direction, and components (specifically, a laser light source 32, a splitter 33, a first linear interferometer 34, a first receiver 35, a second linear interferometer 36, and a second receiver 37) fixed to the base 105 on the negative Y side of the stage.

In the measuring part 30, the splitter 33 splits laser light emitted from the laser light source 32 into two beams. Part of one of the two beams travels through the first linear interferometer 34 into a first area on the plane mirror 31, and the light reflected from the plane mirror 31 interferes with part of the original laser light (which is used as reference light) in the first linear interferometer 34, and is received by the first receiver 35. A distance between the first linear interferometer 34 and the plane mirror 31 in the main scanning direction is specified based on a change in intensity after the interference between the reflected light and the reference light. Based on an output from the first receiver 35, a purpose-built arithmetic circuit (not shown) determines the position of the substrate holding part 10 as measured in the main scanning direction.

On the other hand, part of the other laser light beam produced by the splitter 33 which splits the laser light emitted from the laser light source 32 passes through a mount 38 from the positive X side toward the negative X side, and then travels through the second linear interferometer 36 onto the plane mirror 31. The laser light beam from the second linear interferometer 36 travels into a second area on the plane mirror 31 which is spaced a fixed distance apart from the first area on the plane mirror 31 in the sub-scanning direction. The light reflected from the plane mirror 31 interferes with part of the original laser light in the second linear interferometer 36, and is received by the second receiver 37. A distance between the second linear interferometer 36 and the plane mirror 31 in the main scanning direction is specified based on a change in intensity after the interference between the reflected light and the reference light. Based on an output from the second receiver 37 and the aforementioned output from the first receiver 35, a purpose-built arithmetic circuit (not shown) determines the angle of rotation of the substrate holding part 10.

<1-4. Optical Units 40>

The optical units 40 are mechanisms for directing light onto the upper surface of a substrate W held on the substrate holding part 10 to expose the upper surface of the substrate W to the light. As mentioned above, the drawing apparatus 1 includes the two optical units 40. One of the optical units 40 is responsible for the exposure of one half of the substrate W on the positive X side to light, and the other optical unit 40 is responsible for the exposure of the other half of the substrate W on the negative X side to light. The two optical units 40 are disposed in a spaced apart relationship and fixed to a frame 107 provided over the base 105 so as to extend over the substrate holding part 10 and the stage driving mechanism 20. It should be noted that the two optical units 40 need not be spaced a fixed distance apart from each other, but a mechanism capable of changing the position of one or both of the optical units 40 may be provided to make the distance between the optical units 40 adjustable.

The two optical units 40 are identical in configuration with each other. Specifically, each of the optical units 40 includes a laser driving part 41, a laser oscillator 42, an illumination optical system 43, and a head part 400. The laser driving part 41, the laser oscillator 42, and the illumination optical system 43 are disposed inside a box forming a top. The head part 400 is accommodated inside an annexed box mounted to the positive Y side of the frame 107. The head part 400 mainly includes a spatial light modulation part 44, and a projection optical system 45.

The laser oscillator 42 is driven by the laser driving part 41 to emit laser light from an output mirror (not shown). The illumination optical system 43 changes the light (a spot beam) emitted from the laser oscillator 42 into linear light (a line beam having a linear sectional configuration) having a uniform intensity distribution. The light emitted from the laser oscillator 42 and changed into the line beam in the illumination optical system 43 enters the head part 400, and is subjected to a spatial modulation in accordance with pattern data D (with reference to FIG. 7). The resultant light impinges on the substrate W.

The light entering the head part 400 specifically travels via a mirror 46 into the spatial light modulation part 44 at a determined angle. The spatial light modulation part 44 performs the spatial modulation on the incident light to reflect necessary light which contributes to pattern drawing and unnecessary light which does not contribute to the pattern drawing in respective directions different from each other. The spatial modulation of light specifically means the process of changing a spatial distribution (amplitude, phase, polarization and the like) of the light.

Specifically, the spatial light modulation part 44 includes a spatial light modulator 441 for performing a spatial modulation on incident light under electrical control. The spatial light modulator 441 is disposed so that a normal to the reflective surface thereof is at an angle with respect to the optical axis of the incident light entering the spatial light modulator 441 via the mirror 46, and performs the spatial modulation on the incident light under the control of the controller 90. The spatial light modulator 441 is constructed using, for example, a spatial modulator of a diffraction grating type (e.g., a GLV (grating light valve)) ("GLV" is a registered trademark) and the like. The spatial modulator of a diffraction grating type includes a diffraction grating with a variable depth, and is manufactured, for example, using a semiconductor device manufacturing technique.

The spatial light modulator 441 is configured to include a plurality of spatial light modulation elements arranged one-dimensionally. The operation of each of the spatial light modulation elements is controlled by turning a voltage on and off. Specifically, for example, when the voltage is off, the surface of each spatial light modulation element is a flat surface. In this state, when light enters each spatial light modulation element, the incident light is regularly reflected without being diffracted. This produces a regularly reflected light (zero-order diffracted light). On the other hand, for example, when the voltage is on, parallel grooves arranged at regular intervals are formed in the surface of each spatial light modulation element. In this state, when light enters each spatial light modulation element, beams of regularly reflected light (zero-order diffracted light) cancel each other out to disappear, so that diffracted light of other orders (plus and minus first-order (±1st-order) diffracted light, plus and minus second-order (±2nd-order) diffracted light, and higher-order diffracted light) is produced. To be more precise, the zero-order diffracted light has the lowest intensity, and the diffracted light of other orders has the highest intensity. The spatial light modulator 441 includes a driver circuit unit capable of independently applying a voltage to the spatial light modulation elements, so that the voltage to be applied to each spatial light modulation element is independently changeable.

The projection optical system 45 intercepts the unnecessary light which is included in the light subjected to the spatial modulation in the spatial light modulator 441 and which does not contribute to the pattern drawing, and guides only the necessary light which is included in the light subjected to the spatial modulation in the spatial light modulator 441 and which contributes to the pattern drawing to the upper surface of the substrate W to form an image on the upper surface. The light subjected to the spatial modulation in the spatial light modulator 441 includes the zero-order diffracted light, and the diffracted light of other than zero order (specifically, plus and minus first-order (±1st-order) diffracted light, plus and minus second-order (±2nd-order) diffracted light, and diffracted light of higher order not less than plus and minus third-order (±3rd-order) in relatively trace amounts). The zero-order diffracted light is the necessary light which contributes to the pattern drawing, and other diffracted light is the unnecessary light which does not contribute to the pattern drawing. The necessary light and the unnecessary light are emitted in respective directions different from each other. Specifically, the necessary light is emitted in a negative Z direction along the Z-axis, and the unnecessary light is emitted in the negative Z direction along axes slightly inclined in positive and negative X directions from the Z-axis. The projection optical system 45 intercepts the unnecessary light traveling along the axes slightly inclined in positive and negative X directions from the Z-axis and allows only the necessary light traveling along the Z-axis to pass through by means of a shield plate, for example. The projection optical system 45 may be configured to further include a plurality of lenses constituting a zoom part for increasing (or decreasing) the width of incident light, an objective lens for image-forming the incident light with a determined magnification on the substrate W, and the like, in addition to the shield plate.

To cause the optical units 40 to perform a drawing operation, the controller 90 drives the laser driving part 41 to cause the laser oscillator 42 to emit light therefrom. The emitted light is changed into a line beam in the illumination optical system 43. The line beam travels via the mirror 46 into the spatial light modulator 441 of the spatial light modulation part 44. In the spatial light modulator 441, the spatial light modulation elements are arranged in the sub-scanning direction (in the X-axis direction). The incident light enters the spatial light modulation elements arranged in a line so that the linear sectional configuration of the light beam is along the arrangement of the spatial light modulation elements. The controller 90 provides an instruction to the driver circuit unit based on the pattern data D, whereby the driver circuit unit applies a voltage to one or some of the spatial light modulation elements specified by the instruction. This produces light individually subjected to the spatial modulation in each of the spatial light modulation elements, and the light is emitted toward the substrate W. Assuming that the number of spatial light modulation elements included in the spatial light modulator 441 is N, the spatial light modulator 441 emits spatially modulated light corresponding to N pixels disposed in the sub-scanning direction. The light subjected to the spatial modulation in the spatial light modulator 441 enters the projection optical system 45. In the projection optical system 45, the unnecessary light is intercepted, and only the necessary light is guided to the upper surface of the substrate W. The necessary light is image-formed with the determined magnification on the upper surface of the substrate W.

As will become clear later, each of the optical units 40 is moved in the main scanning direction (in the Y-axis direction) relative to the substrate W while intermittently emitting the spatially modulated light corresponding to the N pixels disposed in the sub-scanning direction (i.e., while continuously projecting pulsed light repeatedly onto the upper surface of the substrate W). Thus, when each of the optical units 40 is moved across the substrate W once in the main scanning direction, a single pattern group having a width corresponding to the N pixels disposed in the sub-scanning direction is drawn on the upper surface of the substrate W. Such a single pattern-drawn region having the width corresponding to the N pixels is also referred to hereinafter as a "one-stripe region."

An optical path correction part for shifting the path of light modulated in the spatial light modulation part 44 slightly in the sub-scanning direction may be further provided between the spatial light modulation part 44 and the projection optical system 45 in the head part 400. In this case, the optical path correction part shifts the path of light, as required, to allow fine adjustment of the position of light impinging upon the substrate W in the sub-scanning direction. The optical path correction part may be implemented, for example, by two wedge prisms (prisms capable of changing the optical path of incident light by having a non-parallel optical surface), and a wedge prisms moving mechanism for moving one of the wedge prisms relative to the other wedge prism linearly along the optical axis of the incident light (in the Z-axis direction). With such an arrangement, the wedge prisms moving mechanism may be drive-controlled to adjust the distance that the two wedge prisms are spaced apart from each other, thereby shifting the incident light by a required amount.

<1-5. Imaging Unit 50>

The imaging unit 50 takes an image of an alignment mark formed on the upper surface of a substrate W. The imaging unit 50 includes a lens barrel, an objective lens, and a CCD image sensor including, for example, an area image sensor (or a two-dimensional image sensor), all of which are not shown. The imaging unit 50 is connected to a fiber 81 extending from the lighting unit 80. Light emitted from the lighting unit 80 is guided by the fiber 81 to the lens barrel, and is also guided through the lens barrel to the upper surface of the substrate W. The light reflected from the upper surface of the substrate W travels through the objective lens, and is received by the CCD image sensor. Thus, imaging data on the upper surface of the substrate W is acquired. The CCD image sensor acquires the imaging data in accordance with an instruction from the controller 90, and transmits the acquired imaging data to the controller 90. The imaging unit 50 may further include an autofocus unit capable of autofocusing.

<1-6. Transport Device 60>

The transport device 60 includes two hands 61 for supporting a substrate W, and a hand driving mechanism 62 for independently moving the hands 61. Each of the hands 61 is driven by the hand driving mechanism 62 to move back and forth and to move up and down, thereby transferring and receiving the substrate W to and from the holding surface 111 of the substrate holding part 10.

<1-7. Prealignment Part 70>

The prealignment part 70 is a device for roughly correcting the rotational position of a substrate W. The prealignment part 70 includes, for example, a rotatable table, a sensor for detecting the position of a cutout (for example, a notch and a orientation flat) formed in part of the outer peripheral edge of the substrate W placed on the table, and a rotational mechanism for rotating the table. In this case, a prealignment process in the prealignment part 70 is performed by initially detecting the position of the cutout of the substrate W placed on the table by means of the sensor, and subsequently rotating the table by means of the rotational mechanism so that the cutout is at a determined position (for example, so that the orientation of the cutout is parallel to the direction (e.g., the X-direction) of the movement of the substrate holding part 10).

<1-8. Controller 90>

The controller 90 is electrically connected to the parts included in the drawing apparatus 1, and controls the operations of the parts of the drawing apparatus 1 while performing various computational processes.

FIG. 7 is a block diagram showing a hardware configuration of the controller 90. The controller 90 is formed by a typical computer in which, for example, the CPU 91, a ROM 92, a RAM 93, an external storage device 94 and the like are interconnected through a bus line 95. The ROM 92 stores a basic program and the like therein, and the RAM 93 serves as a work area used when the CPU 91 performs a predetermined process. The external storage device 94 is formed by a flash memory or a nonvolatile storage device such as a hard disk device. The program P is stored in the external storage device 94. The CPU 91 serving as a main controller performs a computational process in accordance with a procedure descried in the program P, whereby various functions are performed. In general, the program P is used while being previously stored in a memory of the external storage device 94 and the like. However, the program P may be provided in a form (in the form of a program product) stored in a storage medium such as a CD-ROM, a DVD-ROM and an external flash memory (or provided by downloading from an external server through a network), and be stored in the memory of the external storage device 94 and the like in an additional or replaceable manner. Some or all of the functions performed in the controller 90 may be implemented by a purpose-built logic circuit and the like in the form of hardware.

The controller 90 further includes an input part 96, a display part 97, and a communication part 98 which are also connected to the bus line 95. The input part 96 is formed by various switches, a touch panel and the like, and accepts various input setting instructions from an operator. The display part 97 is formed by a liquid crystal display device, a lamp and the like, and displays various pieces of information under the control of the CPU 91. The communication part 98 has a data communication function through a LAN and the like.

The data (pattern data) D on descriptions of a pattern in which a substrate W is to be exposed to light is stored in the external storage device 94. The pattern data D is, for example, data obtained by rasterizing CAD data generated using CAD, and represents a circuit pattern and the like. Prior to a series of processes for a substrate W, the controller 90 acquires the pattern data D to store the pattern data D in the external storage device 94. The acquisition of the pattern data D may be achieved, for example, by receiving the pattern data D from an external terminal device connected through a network or by reading the pattern data D from a storage medium.

<2. Processing Procedure for Substrate W>

Next, a procedure for performing a series of processes on a substrate W in the drawing apparatus 1 will be described with reference to FIG. 8. FIG. 8 is a flow diagram of the processes. A series of operations to be described below are performed under the control of the controller 90.

First, the transport device 60 takes an unprocessed substrate W out of a cassette C placed on the cassette table 104, and transports the unprocessed substrate W into the drawing apparatus 1 (more specifically, into the prealignment part 70) (in Step S1).

Subsequently, the prealignment process is performed on the substrate W in the prealignment part 70 (in Step S2). The prealignment process is performed, for example, by detecting the position of the cutout of the substrate W placed on the table by means of the sensor, and then rotating the table so that the cutout is at a determined position. Thus, the substrate W placed on the table is roughly aligned with the determined rotational position.

Subsequently, the transport device 60 transports the substrate W subjected to the prealignment process out of the prealignment part 70 to place the substrate W on the holding surface 111 of the substrate holding part 10 (in Step S3). This process is specifically performed in a manner to be described below. First, the stage driving mechanism 20 moves the substrate holding part 10 to a determined transfer position. After the substrate holding part 10 is positioned in the transfer position, the lift pin driving mechanism (not shown) moves the group of lift pins 181 from the downward position to the upward position. Thus, the group of lift pins 181 protrudes from the holding surface 111. Subsequently, the transport device 60 inserts one of the hands 61 supporting the substrate W subjected to the prealignment process into the substrate holding part 10 along the holding surface 111, and moves the hand 61 downwardly. Thus, the substrate W placed on the hand 61 is transferred onto the group of lift pins 181. After the hand 61 is withdrawn, the lift pin driving mechanism moves the group of lift pins 181 from the upward position to the downward position. Thus, the substrate W is placed on the holding surface 111.

Figure 9:
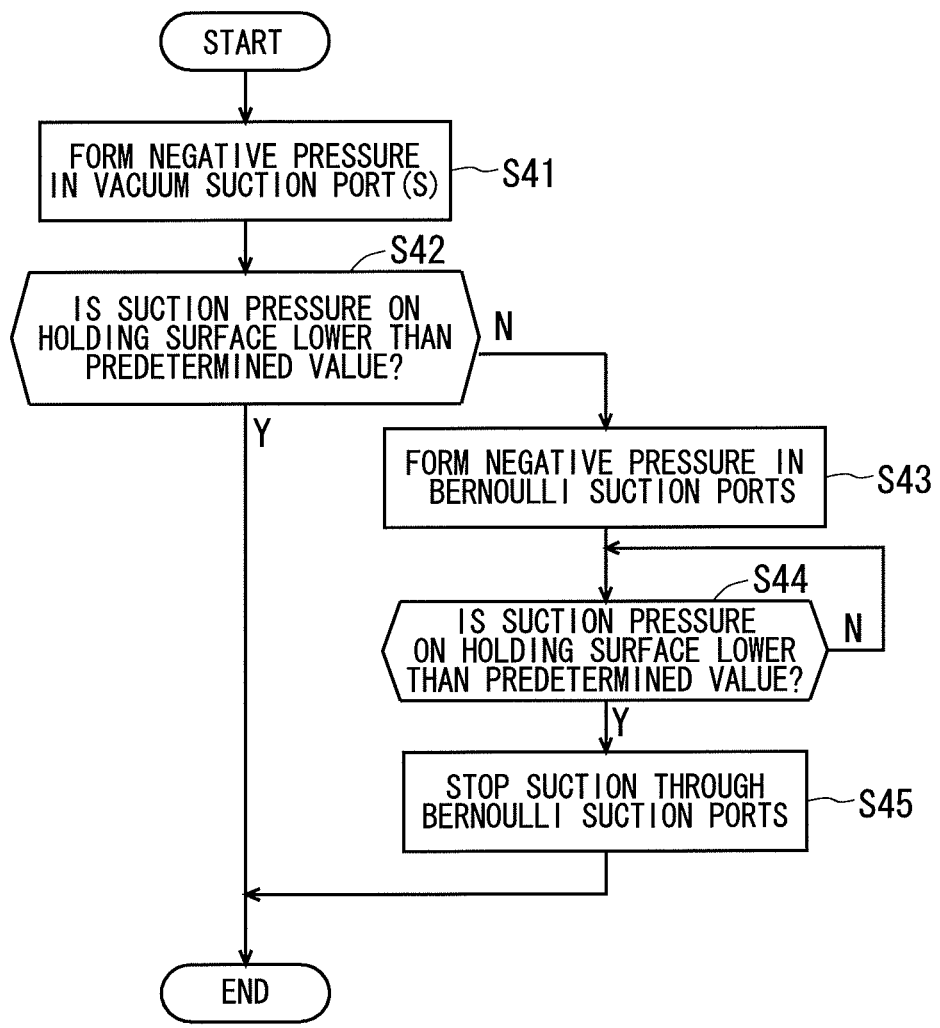
FIG. 9 is a flow diagram showing a procedure for the process of holding a substrate on a substrate holding surface under suction in the substrate holding part.

After the substrate W is placed on the holding surface 111, the substrate holding part 10 holds the substrate W under suction (in Step S4). A procedure for this process will be specifically described with reference to FIG. 9. FIG. 9 is a flow diagram showing the procedure for this process.

After the substrate W is placed on the holding surface 111, the suction controller 19 initially opens the on-off valve 123. This produces a negative pressure (suction pressure) in the vacuum suction port 12 (in Step S41).

When the substrate W is unwarped and flat in shape, the back surface of the substrate W comes in contact with the entire area of the top of the embankment 14, the tops of all of the protrusions 15 and the tops of all of the annular protrusions 16, so that an enclosed space is defined by the embankment 14, the holding surface 111 surrounded by the embankment 14, and the back surface of the substrate W. Thus, in this case, when a negative pressure is formed in the vacuum suction port 12, the pressure in the enclosed space is reduced, so that the substrate W in a flat condition is held on the holding surface 111 under suction, with the back surface of the substrate W lying in a position spaced a distance corresponding to the height of the embankment 14 apart from the holding surface 111. When it is confirmed from information outputted from the pressure sensor 17 that the suction pressure on the holding surface 111 becomes a lower pressure than a predetermined value (or becomes closer to a vacuum pressure than a predetermined value) (i.e., when the pressure detected by the pressure sensor 17 is lower than a predetermined value (for example, −60 kPa)) (YES in Step S42), the suction controller 19 judges that the substrate W is appropriately held under suction, and completes the series of processes for holding the substrate W under suction.

When the substrate W is warped and is not flat in shape, on the other hand, a gap is created between the back surface of the substrate W and at least part of the top of the embankment 14. In this case, when a negative pressure is formed in the vacuum suction port 12, the negative pressure is relieved through the gap, so that the pressure on the holding surface 111 is difficult to decrease. When it is not confirmed from the information outputted from the pressure sensor 17 that the suction pressure on the holding surface 111 becomes a lower pressure than the predetermined value (i.e., when the pressure detected by the pressure sensor 17 is equal to or higher than the predetermined value (for example, −60 kPa)) after a lapse of a predetermined time period since the start of the suction through the vacuum suction port 12 (NO in Step S42), the suction controller 19 judges that the substrate W is not appropriately held on the holding surface 111 under suction (or that a suction failure occurs), and opens the on-off valve 137. Then, a negative pressure (suction pressure) is formed in all of the Bernoulli suction ports 13 (in Step S43).

As mentioned above, at least one of the Bernoulli suction ports 13 is disposed in each of the circular region M1 and the annular region M2 which are defined on the holding surface 111 (with reference to FIG. 3). When the substrate W is warped in a convex form, a substantially central portion of the substrate W is strongly sucked and attracted to the holding surface 111 by the negative pressure formed in at least one Bernoulli suction port 13 disposed in the circular region M1. When the substrate W is warped in a concave form, on the other and, a substantially peripheral portion of the substrate W is strongly sucked and attracted to the holding surface 111 by the negative pressure formed in at least one Bernoulli suction port 13 disposed in the annular region M2. Thus, whether the substrate W is warped in a convex form or in a concave form, the substrate W is flattened by the negative pressure formed in the Bernoulli suction ports 13.

When the substrate W is flattened in shape, the back surface of the substrate W comes in contact with the entire area of the top of the embankment 14, the tops of all of the protrusions 15 and the tops of all of the annular protrusions 16, so that the enclosed space is defined by the embankment 14, the holding surface 111 surrounded by the embankment 14, and the back surface of the substrate W, as mentioned above. Then, the pressure in the enclosed space is reduced by the negative pressure formed in the vacuum suction port 12 and in the Bernoulli suction ports 13, so that the substrate W in a flat condition is held on the holding surface 111 under suction, with the back surface of the substrate W lying in a position spaced a distance corresponding to the height of the embankment 14 apart from the holding surface 111. When it is confirmed from the information outputted from the pressure sensor 17 that the suction pressure on the holding surface 111 becomes a lower pressure than the predetermined value (i.e., when the pressure detected by the pressure sensor 17 is lower than the predetermined value (for example, −60 kPa)) (YES in Step S44), the suction controller 19 closes the on-off valve 137 to stop the suction through the Bernoulli suction ports 13 (in Step S45). As mentioned above, the substrate W is already flat in shape, and the enclosed space is defined by the embankment 14, the holding surface 111 surrounded by the embankment 14, and the back surface of the substrate W. As a result, after the suction through the Bernoulli suction ports 13 is stopped, the substrate W is maintained held appropriately on the holding surface 111 under suction by the negative pressure formed in the vacuum suction port 12. The suction controller 19 thus completes the series of processes for holding the substrate W under suction.

Reference is made again to FIG. 8. After the substrate W is held under suction, a precise alignment process (or fine alignment) is performed to place the substrate W in a proper rotational position (in Step S5). Specifically, the stage driving mechanism 20 initially moves the substrate holding part 10 from the transfer position to a position lying under the imaging unit 50. After the substrate holding part 10 is placed under the imaging unit 50, the imaging unit 50 then takes an image of the alignment mark on the substrate W to acquire the imaging data. Subsequently, the controller 90 performs an image analysis on the imaging data acquired by the imaging unit 50 to detect the position of the alignment mark, thereby calculating the amount of deviation of the substrate W from the proper rotational position, based on the detected position. After the calculation of the amount of deviation, the rotational mechanism 21 rotates the substrate holding part 10 through the calculated amount of deviation. This achieves the alignment so that the substrate W is placed in the proper rotational position.

After the substrate W is placed in the proper rotational position, the process of drawing a pattern is performed (in Step S6). The drawing process will be described with reference to FIG. 10. FIG. 10 is a view for illustrating the drawing process.

The drawing process is performed by directing the spatially modulated light from each of the optical units 40 onto the upper surface of the substrate W while the stage driving mechanism 20 moves the substrate W placed on the substrate holding part 10 relative to the optical units 40.

Specifically, the stage driving mechanism 20 initially moves the substrate holding part 10 lying under the imaging unit 50 in the positive Y direction along the main scanning direction (Y-axis direction) to thereby move the substrate W relative to the optical units 40 along the main scanning direction (which is referred to as main scanning). As viewed from the standpoint of the substrate W, the optical units 40 move across over the substrate W in the negative Y direction along the main scanning direction (as indicated by the arrows AR11). During the main scanning, each of the optical units 40 intermittently directs the light subjected to the spatial modulation in accordance with the pattern data D (specifically, the spatially modulated light corresponding to the N pixels disposed in the sub-scanning direction) toward the substrate W (i.e., the pulsed light is continuously projected repeatedly onto the upper surface of the substrate W). In other words, each of the optical units 40 moves across over the substrate W along the main scanning direction while intermittently directing the spatially modulated light corresponding to the N pixels disposed in the sub-scanning direction. Thus, when each of the optical units 40 is moved across the substrate W once along the main scanning direction, a single pattern group having a width corresponding to the N pixels disposed in the sub-scanning direction is drawn on the upper surface of the substrate W. In this case, two pattern groups are drawn by the single main scanning because the two optical units 40 are moved across the substrate W at the same time.

After the main scanning is completed once, the stage driving mechanism 20 moves the substrate holding part 10 a distance corresponding to the width of one stripe in the positive X direction along the sub-scanning direction (the X-axis direction) to thereby move the substrate W relative to the optical units 40 along the sub-scanning direction (which is referred to as sub-scanning). As viewed from the standpoint of the substrate W, the optical units 40 move the distance corresponding to the width of one stripe in the negative X direction along the sub-scanning direction (as indicated by the arrows AR12).

Upon completion of the sub-scanning, the main scanning is performed again. Specifically, the stage driving mechanism 20 moves the substrate holding part 10 in the negative Y direction along the main scanning direction to thereby move the substrate W relative to the optical units 40 along the main scanning direction. As viewed from the standpoint of the substrate W, the optical units 40 move across over the substrate W in the positive Y direction along the main scanning direction (as indicated by the arrows AR13) through a region adjacent to the one-stripe region drawn in the preceding main scanning. Also in this stage, each of the optical units 40 moves across over the substrate W along the main scanning direction while intermittently directing the light subjected to the spatial modulation in accordance with the pattern data D toward the substrate W. This achieves the drawing of another one-stripe region adjacent to the one-stripe region drawn in the preceding main scanning. Thereafter, the main scanning and the sub-scanning are similarly performed in a repeated manner until the pattern is drawn on the entire upper surface of the substrate W. Then, the drawing process is completed.

Reference is made again to FIG. 8. After the drawing process is completed, the stage driving mechanism 20 moves the substrate holding part 10 to the transfer position. After the substrate holding part 10 is placed in the transfer position, the suction controller 19 closes the on-off valve 123 to stop the suction through the vacuum suction port 12. This causes a gas to flow through the vacuum suction port 12 into the enclosed space, so that the attraction of the substrate W by suction is released (in Step S7).

After the attraction of the substrate W to the holding surface 111 by suction is released, the transport device 60 receives the processed substrate W placed on the holding surface 111 to transport the processed substrate W out of the drawing apparatus 1, and then stores the processed substrate W into a cassette C placed on the cassette table 104 (in Step S8). Specifically, the transport device 60 performs the process of receiving the substrate W from the holding surface 111 in a manner to be described below. First, the lift pin driving mechanism (not shown) moves the group of lift pins 181 from the downward position to the upward position. This causes the group of lift pins 181 to support the lower surface of the substrate W and to lift the substrate W off the substrate holding part 10, thereby removing the lower surface of the substrate W from the holding surface 111. Subsequently, the transport device 60 inserts one of the hands 61 into the space lying between the holding surface 111 and the lower surface of the substrate W, and moves the hand 61 upwardly. This causes the substrate W supported on the group of lift pins 181 to be transferred onto the hand 61. Subsequently, the hand 61 is withdrawn. Then, the lift pin driving mechanism moves the group of lift pins 181 from the upward position to the downward position.

<3. Effects>

According to the first preferred embodiment, the Bernoulli suction ports 13 are disposed in the circular region M1 and the annular region M2 which are defined on the holding surface 111. Thus, whether the substrate W is warped in a convex form or in a concave form, the suction through the Bernoulli suction ports 13 corrects the warpage to flatten the substrate W. Thus, the technique according to the first preferred embodiment is capable of securely holding a substrate W (specifically, at least part of the substrate W including the exposure region) under suction with a simple configuration even when the substrate W is warped. This avoids the occurrence of a situation such that the substrate W is out of position relative to the holding surface 111 during a series of processes performed on the substrate W to ensure the appropriate execution of the series of processes on the substrate W. In other words, a high-precision drawing process is ensured.

Also according to the first preferred embodiment, the substrate W is held under suction while being in contact with the top of the embankment 14 and the tops of the protrusions 15. In such a configuration, the substrate W in a flat condition is held on the holding surface 111 under suction, with the back surface of the substrate W lying in a position spaced a distance corresponding to the height of the embankment 14 apart from the holding surface 111. For this reason, there is no danger that a mark is made on the back surface of the substrate W by the suction through the vacuum suction port 12.

Also according to the first preferred embodiment, the Bernoulli suction ports 13 are arranged in a circumferential direction of the annular region M2 of the holding surface 111. In such a configuration, even when the substrate W is warped in a concave form, the suction pressure in the Bernoulli suction ports 13 disposed in the annular region M2 corrects the warpage to flatten the substrate W, whereby the substrate W is securely held under suction.

Also according to the first preferred embodiment, the suction through the Bernoulli suction ports 13 is started, when the suction pressure on the holding surface 111 does not become a lower pressure than the predetermined value after the suction through the vacuum suction port 12 is performed. In such a configuration, the suction through the Bernoulli suction ports 13 is not performed, for example, when the substrate W placed on the holding surface 111 is originally unwarped and flat in shape. This suppresses wasteful consumption of air. Additionally, there is no danger that the back surface of the substrate W is contaminated.

Also according to the first preferred embodiment, the suction through the Bernoulli suction ports 13 is stopped, when the suction pressure on the holding surface 111 becomes a lower pressure than the predetermined value after the suction through the Bernoulli suction ports 13 is started. In other words, after the substrate W which is warped is flattened by the suction through the Bernoulli suction ports 13 and is hence appropriately held under suction, the substrate W is held under suction only by the suction through the vacuum suction port 12. In such a configuration, the suction through the Bernoulli suction ports 13 is suppressed to a required minimum level. This suppresses wasteful consumption of air. Additionally, this decreases the danger that the back surface of the substrate W is contaminated.

Also according to the first preferred embodiment, the suction through the Bernoulli suction ports 13 is started while the suction through the vacuum suction port 12 is performed (i.e., while at least part of the substrate W is attracted to the holding surface 111 by the suction pressure in the vacuum suction port 12). In such a configuration, a situation such that the substrate W is put out of position at the start of the suction through the Bernoulli suction ports 13 is less prone to occur.

Also according to the first preferred embodiment, the gap Q is defined between the body part 131 of the Bernoulli suction unit 130 and the recess 112 formed in the holding plate 11. The gas flowing over the cylindrical recessed space 132 flows along the gap Q, and is discharged toward the back surface of the holding plate 11. Thus, even when the back surface of the substrate W is in contact with the top of the annular protrusion 16 formed on the outer edge of each of the Bernoulli suction ports 13 (i.e., each of the Bernoulli suction ports 13 is blocked by the back surface of the substrate W), a strong swirl flow is continuously produced within the cylindrical recessed space 132. In other words, the negative pressure in each of the Bernoulli suction ports 13 is continuously maintained.

Also according to the first preferred embodiment, the diameter d13 of the Bernoulli suction ports 13 is less than the diameter d132 of the cylindrical recessed space 132. In such a configuration, the back surface of the substrate W has a smaller area on which the suction pressure is exerted. Thus, there is no danger that the suction through the Bernoulli suction ports 13 deteriorates the flatness of the substrate W.

<<Second Preferred Embodiment>>

A drawing apparatus according to a second preferred embodiment of the present invention will be described. The drawing apparatus according to the second preferred embodiment differs from that according to the first preferred embodiment in the configuration of the holding surface of the substrate holding part which holds a substrate W in a horizontal position under suction and in the manner in which the substrate W is held on the holding surface under suction. The differences from the first preferred embodiment will be described hereinafter. Components similar to those of the first preferred embodiment are designated by the same reference numerals and characters, and will not be described.

<1. Substrate Holding Part 10a>

Figure 11:
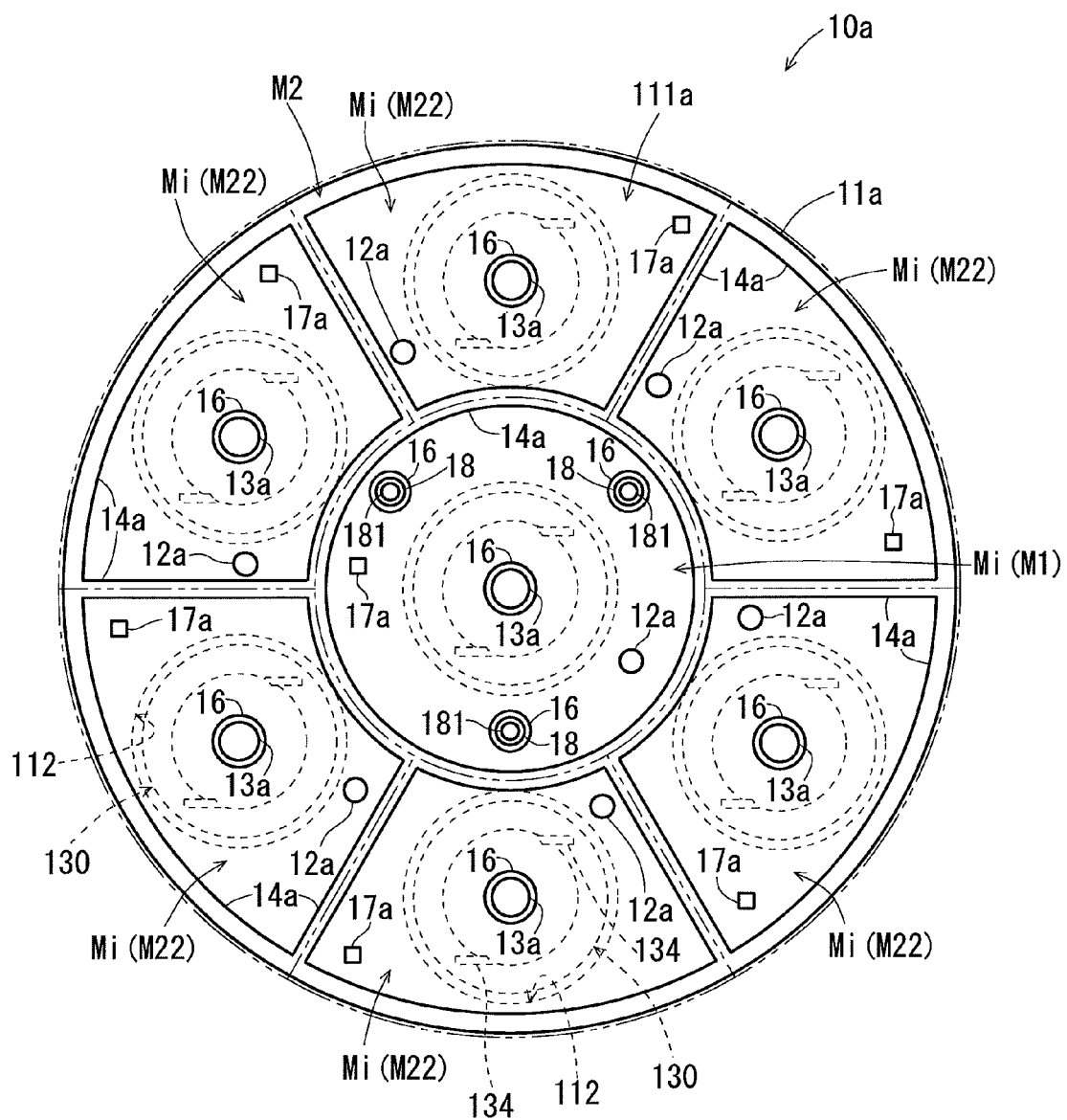
FIG. 11 is a plan view of the substrate holding part according to a second preferred embodiment of the present invention.
Figure 12:
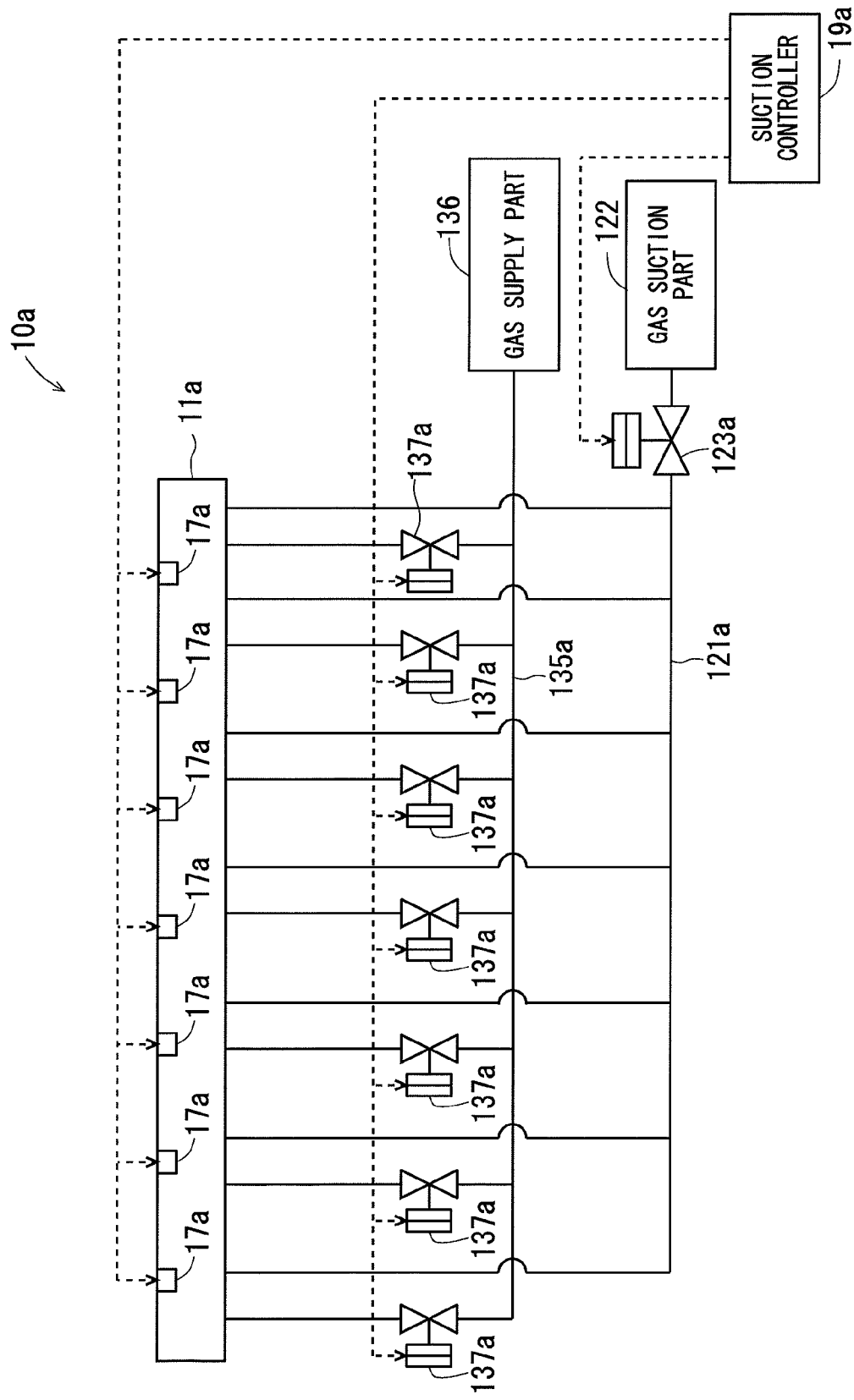
FIG. 12 schematically illustrates a piping system included in the substrate holding part according to the second preferred embodiment.

The configuration of a substrate holding part 10a will be described with reference to FIGS. 11 and 12. FIG. 11 is a plan view of the substrate holding part 10a. FIG. 12 schematically illustrates a piping system included in the substrate holding part 10a.

Like the substrate holding part 10 according to the first preferred embodiment, the substrate holding part 10a includes a holding plate 11a having a planar outside shape. The upper surface of the holding plate 11a serves as a holding surface 111a configured to be opposed to the back surface of a substrate W. Also according to the second preferred embodiment, the holding surface 111a is formed to have a flatness sufficiently small in value as compared with the depth of focus of the optical units 40. The holding surface 111a is sized to cover at least the exposure region of a substrate W. The substrate W shall be circular in shape, and the holding surface 111a is also circular in shape as seen in plan view according to the second preferred embodiment.

<Suction Ports 12a and 13a>

The holding surface 111a includes suction ports 12a and 13a formed therein. The suction ports 12a, which are half of the suction ports 12a and 13a, are vacuum suction ports 12a which attract a substrate W to the holding surface 111a by vacuum suction. The suction ports 13a, which are remaining half of the suction ports 12a and 13a, are Bernoulli suction ports 13a which attract a substrate W to the holding surface 111a by Bernoulli suction. The vacuum suction ports 12a and the Bernoulli suction ports 13a are equal in number (in the illustration, seven vacuum suction ports 12a and seven Bernoulli suction ports 13a).

The arrangement of the vacuum suction ports 12a and the Bernoulli suction ports 13a will be described. As in the first preferred embodiment, the holding surface 111a has the two specified regions: the circular region M1 disposed concentrically with the center of the holding surface 111a, and the annular region M2 disposed concentrically with the circular region M1. The annular region M2 is divided into a plurality of (in the illustration, six) arcuate regions M22 arranged in a circumferential direction thereof. That is, the circular region M1 and the plurality of arcuate regions M22 are defined on the holding surface 111a according to the second preferred embodiment. The circular region M1 and the arcuate regions M22 are generically referred to as "partial regions Mi" hereinafter. At least one of the vacuum suction ports 12a and at least one of the Bernoulli suction ports 13a (in the illustration, one vacuum suction port 12a and one Bernoulli suction port 13a) are disposed in each of the partial regions Mi defined on the holding surface 111a.

It is preferable that the arcuate regions M22 are equal in area to each other. It is also preferable that each of the arcuate regions M22 is equal in area to the circular region M1 (i.e., the partial regions Mi are equal in area to each other). When the partial regions Mi are equal in area to each other, at least one of the vacuum suction ports 12a and at least one of the Bernoulli suction ports 13a which are equal in number are disposed in each of the partial regions Mi.

The vacuum suction ports 12a are connected to branched ends of branch piping 121a which are equal in number to the vacuum suction ports 12a. The branch piping 121a further has a joined end connected to the gas suction part 122. An on-off valve 123a is interposed at some midpoint (in a joined portion) of the branch piping 121a. When the gas suction part 122 is put in operation and the on-off valve 123a is opened, a negative pressure (suction pressure) is produced in the vacuum suction ports 12a through the branch piping 121a.

Each of the Bernoulli suction ports 13a is in communication with the recess 112 in which the Bernoulli suction unit 130 is disposed. The Bernoulli suction unit 130 has a configuration as described above. Branch piping 135a has branched ends equal in number to the Bernoulli suction ports 13a. Each of the branched ends of the branch piping 135a is connected to the pair of ejection nozzles 134 of the Bernoulli suction unit 130. The branch piping 135a further has a joined end connected to the gas supply part 136. On-off valves 137a are interposed at some midpoint (in branched portions, respectively) of the branch piping 135a. A filter is also interposed at some midpoint (in a joined portion) of the branch piping 135a. When the gas supply part 136 is put in operation and any one of the on-off valves 137a is opened, a compressed gas is supplied through the branch piping 135a to the corresponding Bernoulli suction unit 130 connected to a branched portion of the branch piping 135a in which the opened on-off valve 137a is interposed (more specifically, the compressed gas is ejected from the pair of ejection nozzles 134 included in the corresponding Bernoulli suction unit 130). This produces a negative pressure in a Bernoulli suction port 13a in communication with the recess 112 in which the corresponding Bernoulli suction unit 130 is disposed. Thus, this configuration allows a negative pressure to be formed independently in the Bernoulli suction ports 13a.

<Embankments 14a>

Embankments 14a are provided upright along the boundaries of the respective partial regions Mi on the holding surface 111a. In other words, the embankments 14a are provided upright on the holding surface 111a so as to surround the respective partial regions Mi. As in the first preferred embodiment, the multiple protrusions 15 are disposed upright evenly in the entire region of each of the partial regions Mi surrounded by the embankments 14a (with reference to FIGS. 4 and 5). Further, the annular protrusions 16 are provided upright along the outer edges of the respective Bernoulli suction ports 13a and the outer edges of respective pin holes 18. The protrusions 15 are not shown in FIG. 11.

As in the first preferred embodiment, the tops of the embankments 14a, the tops of the protrusions 15 and the tops of the annular protrusions 16 are flush with each other, and the plane in which these tops are disposed is adapted to have a flatness sufficiently small in value as compared with the depth of focus of the optical units 40. When a flat substrate W is placed on the holding surface 111a, the back surface of the substrate W comes in contact with the entire area of the tops of all of the embankments 14a, the tops of all of the protrusions 15 and the tops of all of the annular protrusion 16, so that enclosed spaces are defined by the embankments 14a, the partial regions Mi surrounded by the embankments 14a, and the back surface of the substrate W. In this state, when a negative pressure is formed in the vacuum suction ports 12a defined in the partial regions Mi, the pressure in the enclosed spaces is reduced, so that the substrate W (specifically, at least part of the substrate W including the exposure region) in a flat condition is held on the holding surface 111a under suction, with the back surface of the substrate W lying in a position spaced a distance corresponding to the height of the embankments 14a apart from the holding surface 111a.

<Pressure Sensors 17a>

Pressure sensors 17a are disposed on the holding surface 111a. One of the pressure sensors 17a is positioned in each of the partial regions Mi defined on the holding surface 111a. Each of the pressure sensors 17a detects the pressure on the holding surface 111 in a corresponding position thereof.

<Lift Pins 181>

Like the substrate holding part 10 according to the first preferred embodiment, the substrate holding part 10a includes the plurality of lift pins 181 for moving the substrate W upwardly and downwardly relative to the holding surface 111a, and the pin holes 18 farmed in the holding surface 111a and allowing the respective lift pins 181 to pass therethrough. The lift pins 181 and the pin holes 18 according to the second preferred embodiment are similar in configuration to the lift pins 181 and the pin holes 18 according to the first preferred embodiment.

<Suction Controller 19a>

Like the substrate holding part 10 according to the first preferred embodiment, the substrate holding part 10a further includes a suction controller 19a for controlling the components of the substrate holding part 10a. The suction controller 19a is implemented in the controller 90, for example, by the CPU 91 performing a predetermined computation process in accordance with the program P or by a purpose-built logic circuit and the like in the form of hardware (with reference to FIG. 7).

The suction controller 19a is electrically connected to the pressure sensors 17a, and is configured to be able to acquire a detection signal from each of the pressure sensors 17a. The suction controller 19a is also electrically connected to the on-off valve 123a and the on-off valves 137a, and controls the opening and closing of the on-off valves 123a and 137a independently, based on the detection signal and the like provided from the pressure sensors 17a. Specifically, the suction controller 19a controls the formation of the suction pressures in the suction ports (the vacuum suction ports 12a and the Bernoulli suction ports 13a) formed in the holding surface 111a, based on the detection signal and the like provided from the pressure sensors 17a. Such control will be described later in detail.

<2. Processing Procedure for Holding Substrate W Under Suction>

A processing procedure in which the substrate holding part 10a holds a substrate W on the holding surface 111a under suction (or a processing procedure in Step S4 of FIG. 8) will be described. This process is substantially similar in procedure to that in Step S4 of the first preferred embodiment, and will be described with reference to FIG. 9 which is referenced earlier.

After the substrate W is placed on the holding surface 111a, the suction controller 19a initially opens the on-off valve 123a. This produces a negative pressure in each of the vacuum suction ports 12a (in Step S41).

When the entire area of the top of the embankment 14a surrounding a given one of the partial regions Mi defined on the holding surface 111a is in contact with the back surface of the substrate W, an enclosed space is defined by the embankment 14a, the given partial region Mi surrounded by the embankment 14a, and the back surface of the substrate W.

Thus, in this case, when a negative pressure is formed in a corresponding one of the vacuum suction ports 12a disposed in the given partial region Mi, the pressure in the enclosed space is reduced.

When the substrate W is unwarped and flat in shape, the pressure on the holding surface 111a is reduced in all of the partial regions Mi (i.e., in the entire area of the holding surface 111a). When it is confirmed from information outputted from the pressure sensors 17a that the suction pressure on the holding surface 111a in all of the partial regions Mi becomes a lower pressure than a predetermined value (YES in Step S42), the suction controller 19a judges that the substrate W is appropriately held on the holding surface 111a under suction, and completes the series of processes for holding the substrate W under suction.

When the substrate W is warped and is not flat in shape, on the other hand, a gap is created in at least one of the partial regions Mi between the back surface of the substrate W and at least part of the top of the embankment 14a surrounding the at least one partial region Mi. In this case, when a negative pressure is formed in the vacuum suction port 12a disposed in the at least one partial region Mi, the negative pressure is relieved through the gap, so that the pressure on the holding surface 111 is difficult to decrease in the at least one partial region Mi. When it is not confirmed from the information outputted from the pressure sensors 17a that the suction pressure on the holding surface 111a in all of the partial regions Mi becomes a lower pressure than the predetermined value (i.e., when there is at least one partial region Mi in which the suction pressure is not lower than the predetermined value) after a lapse of a predetermined time period since the start of the suction through the vacuum suction ports 12a (NO in Step S42), the suction controller 19a judges that the substrate W is not appropriately held on the holding surface 111a under suction (or that a suction failure occurs), and subsequently opens the on-off valves 137a to form a negative pressure in the Bernoulli suction ports 13a (in Step S43).

The process in Step S43 will be specifically described. As mentioned above, the substrate holding part 10a includes the Bernoulli suction ports 13a, and the suction controller 19a independently controls the opening and closing of the on-off valves 137a to independently form a negative pressure in the Bernoulli suction ports 13a. If a comparison is made between the suction pressure formed in each of the Bernoulli suction ports 13a when all of the on-off valves 137a are opened and the suction pressure formed in a Bernoulli suction port 13a corresponding to one of the on-off valves 137a when only the one on-off valve 137a is opened and the remaining on-off valves 137a are closed, the latter is lower than the former. In other words, the latter is strong in sucking force. This is because, in the latter case, the compressed gas supplied from the gas supply part 136 is not dispersed but is supplied in large amounts to the single Bernoulli suction unit 130 in a focused manner.

Thus, the suction controller 19a controls the opening and closing of the on-off valves 137a, for example, so as to select the Bernoulli suction ports 13a at least one at a time (preferably, one at a time) in succession to form a negative pressure only in the at least one selected Bernoulli suction port 13a. Specifically, the suction controller 19a initially selects at least one of the Bernoulli suction ports 13a to open at least one on-off valve 137a corresponding to the at least one selected Bernoulli suction port 13a (more specifically, at least one on-off valve 137a interposed in at least one branched portion of the branch piping 135a connected to the Bernoulli suction unit 130 disposed in the recess 112 in communication with the at least one selected Bernoulli suction port 13a), with the remaining on-off valves 137a maintained closed. After a lapse of a determined time period in this state, the suction controller 19a selects at least one different Bernoulli suction port 13a to open at least one on-off valve 137a corresponding to the at least one selected Bernoulli suction port 13a, with the remaining on-off valves 137a maintained closed. Thereafter, the suction controller 19a performs similar switching between the on-off valves 137a in succession. Thus, a negative pressure is formed in the Bernoulli suction ports 13a in order.

Figure 13:
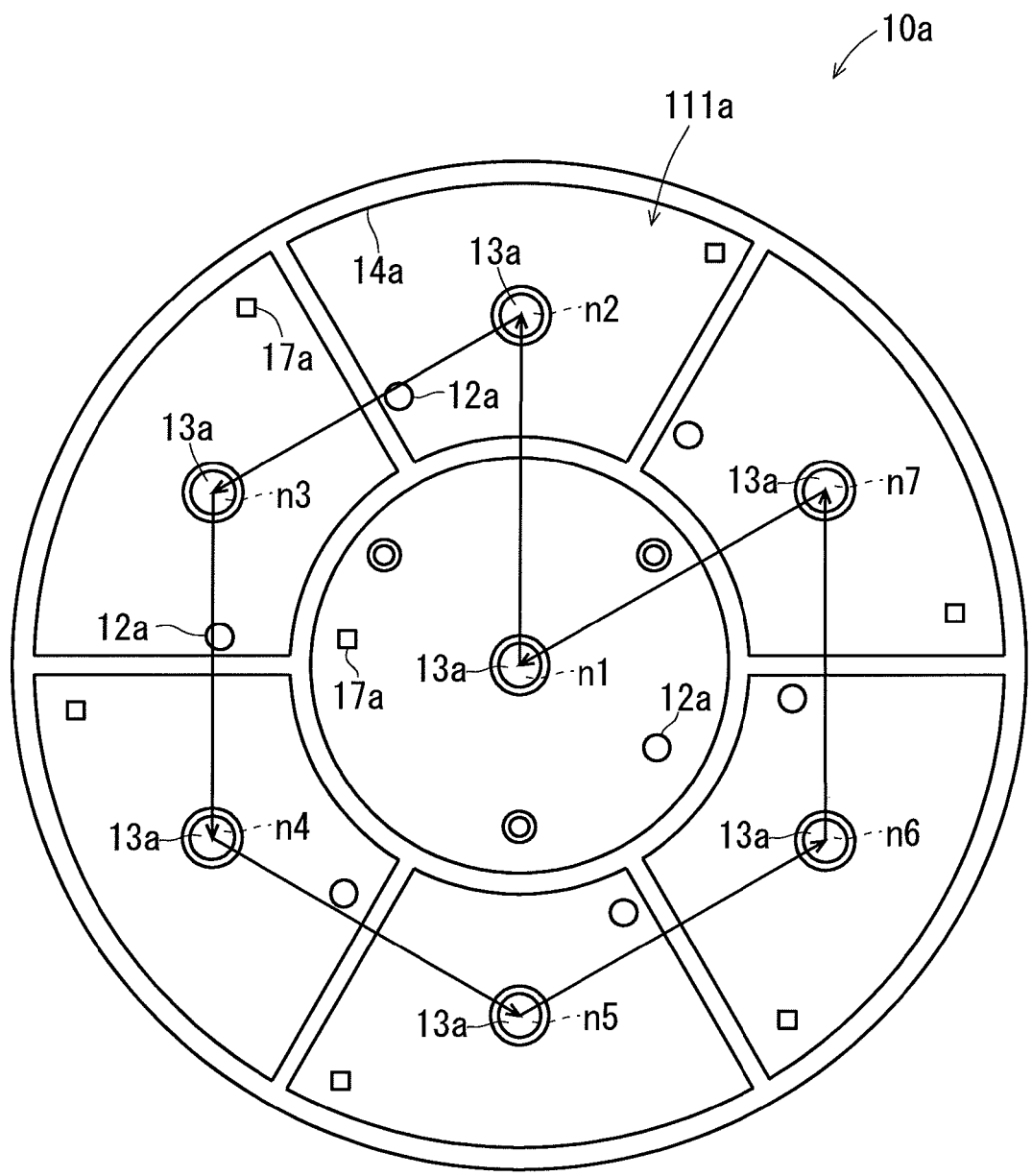
FIG. 13 is a view for illustrating an example of a configuration for forming a negative pressure in Bernoulli suction ports in succession.

The order in which the negative pressure is formed in the Bernoulli suction ports 13a (i.e., the order of selection of the Bernoulli suction ports 13a) may be arbitrarily specified. For example, as shown in FIG. 13, the order may be as follows: the negative pressure is initially formed in the Bernoulli suction port 13a disposed in the circular region M1 (n1); the negative pressure is subsequently formed in the Bernoulli suction ports 13a disposed in the annular region M2 in counterclockwise order (or in clockwise order) (in the order of n2, n3, n4, n5, n6, and n7); and the negative pressure is then formed again in the Bernoulli suction port 13a disposed in the circular region M1 (n1). That is, the order is n1, n2, n3, n4, n5, n6, n7, n1, n2, . . . . In this configuration, even if a substantially central portion of a substrate W which is warped in a convex form, for example, is not securely attracted to the holding surface 111a by suction during the first suction through the Bernoulli suction port 13a disposed in the circular region M1, the substrate W is flattened gradually in such a manner that a portion more prone to be attracted (or a less warped portion) of the substrate W becomes flat earlier, while the suction through the Bernoulli suction ports 13a in succession is performed. Thus, the substantially central portion of the substrate W is securely attracted to the holding surface 111a by suction when at least the second suction through the Bernoulli suction port 13a disposed in the circular region M1 is performed.

Alternatively, while the negative pressure is always formed continuously in the Bernoulli suction port 13a disposed in the circular region M1, the negative pressure may be formed in the Bernoulli suction ports 13a disposed in the annular region M2 in succession in counterclockwise order (or in clockwise order).

Also alternatively, the negative pressure may be preferentially formed in a Bernoulli suction port 13a disposed in a partial region Mi which is weak in suction pressure on the holding surface 111a. In this case, the suction controller 19a initially selects the Bernoulli suction port 13a corresponding to one of the pressure sensors 17a disposed on the holding surface 111a which has detected the weakest suction pressure (i.e., the Bernoulli suction port 13a disposed in the partial region Mi in which the one pressure sensor 17a is disposed), and subsequently selects the Bernoulli suction port 13a corresponding to one of the pressure sensors 17a which has detected the second weakest suction pressure. Subsequently, the suction controller 19a selects the Bernoulli suction ports 13a in a similar manner.

As the suction controller 19 controls the opening and closing of the on-off valves 137a in the aforementioned manner, the substrate W is gradually flattened by the negative pressure formed in the Bernoulli suction ports 13 in succession. As mentioned above, at least one of the Bernoulli suction ports 13 is disposed in each of the circular region M1 and the annular region M2 which are defined on the holding surface 111a. Thus, whether the substrate W is warped in a convex form or in a concave form, the substrate W is flattened by the negative pressure formed in the Bernoulli suction ports 13a in succession.

When the substrate W is flattened in shape, the pressure on the holding surface 111a is reduced in all of the partial regions Mi (i.e., the entire region of the holding surface 111a), as mentioned above. When it is confirmed from the information outputted from the pressure sensors 17a that the suction pressure on the holding surface 111a in all of the partial regions Mi becomes a lower pressure than the predetermined value (YES in Step S44), the suction controller 19a closes all of the on-off valves 137a to stop the suction through all of the Bernoulli suction ports 13a (in Step S45). As mentioned above, the substrate W is already flat in shape, and the enclosed spaces are defined in all of the partial regions Mi by the embankments 14a, the partial regions Mi surrounded by the embankments 14a, and the back surface of the substrate W. As a result, after the suction through the Bernoulli suction ports 13a is stopped, the substrate W is maintained held on the holding surface 111a under suction by the negative pressure formed in the vacuum suction ports 12a. The suction controller 19a thus completes the series of processes for holding the substrate W under suction.

<3. Effects>

The second preferred embodiment produces effects similar to those of the first preferred embodiment. According to the second preferred embodiment, at least one of the vacuum suction ports 12a and at least one of the Bernoulli suction ports 13a are disposed in each of the partial regions Mi (the arcuate regions M22 and the circular region M1) defined on the holding surface 111a, and the embankments 14a are formed to surround the respective partial regions Mi. In such a configuration, the enclosed spaces are defined between the respective partial regions Mi and the back surface of the substrate W, so that the back surface of the substrate W is held under suction independently by the partial regions Mi. This corrects the warpage to flatten the substrate W efficiently without waste, so that the substrate W is securely held under suction.

In particular, making the arcuate regions M22 equal in area to each other allows the enclosed spaces defined between the respective arcuate regions M22 and the back surface of the substrate W to be equal in volume to each other, so that equal sucking forces are exerted on the substrate W in the respective arcuate regions M22. This allows the substrate W, if warped in any form, to be securely flattened and held under suction.

<<Modifications>>

<1. First Modification>

The suction controller 19a according to the second preferred embodiment may acquire information (warpage shape information) indicative of the shape of warpage of a substrate W to be processed, for example, by accepting the information from an operator through the input part 96 (FIG. 7) (or acquire the information by measuring the shape of warpage of the substrate W placed on the holding surface 111a with an optical sensor or the like disposed near the holding surface 111a), to thereby control the opening and closing of the on-off valves 137a in accordance with the warpage shape information.

Specifically, when the substrate W to be processed is warped, for example, in a concave form, the suction controller 19a controls the opening and closing of the on-off valves 137a so that the negative pressure is formed only in the Bernoulli suction ports 13a disposed in the annular region M2. Then, the substrate W is smoothly flattened by the negative pressure formed in the Bernoulli suction ports 13a disposed in the annular region M2. On the other hand, when the substrate W to be processed is warped in a convex form, the suction controller 19a controls the opening and closing of the on-off valves 137a so that the negative pressure is formed only in the Bernoulli suction port 13a disposed in the circular region M1. Then, the substrate W is smoothly flattened by the negative pressure formed in the Bernoulli suction port 13a disposed in the circular region M1.

<2. Second Modification>

In the aforementioned preferred embodiments, the negative pressure (suction pressure) in the vacuum suction ports 12 and 12a and the negative pressure (suction pressure) in the Bernoulli suction ports 13 and 13a may be adjustable.

Figure 14:
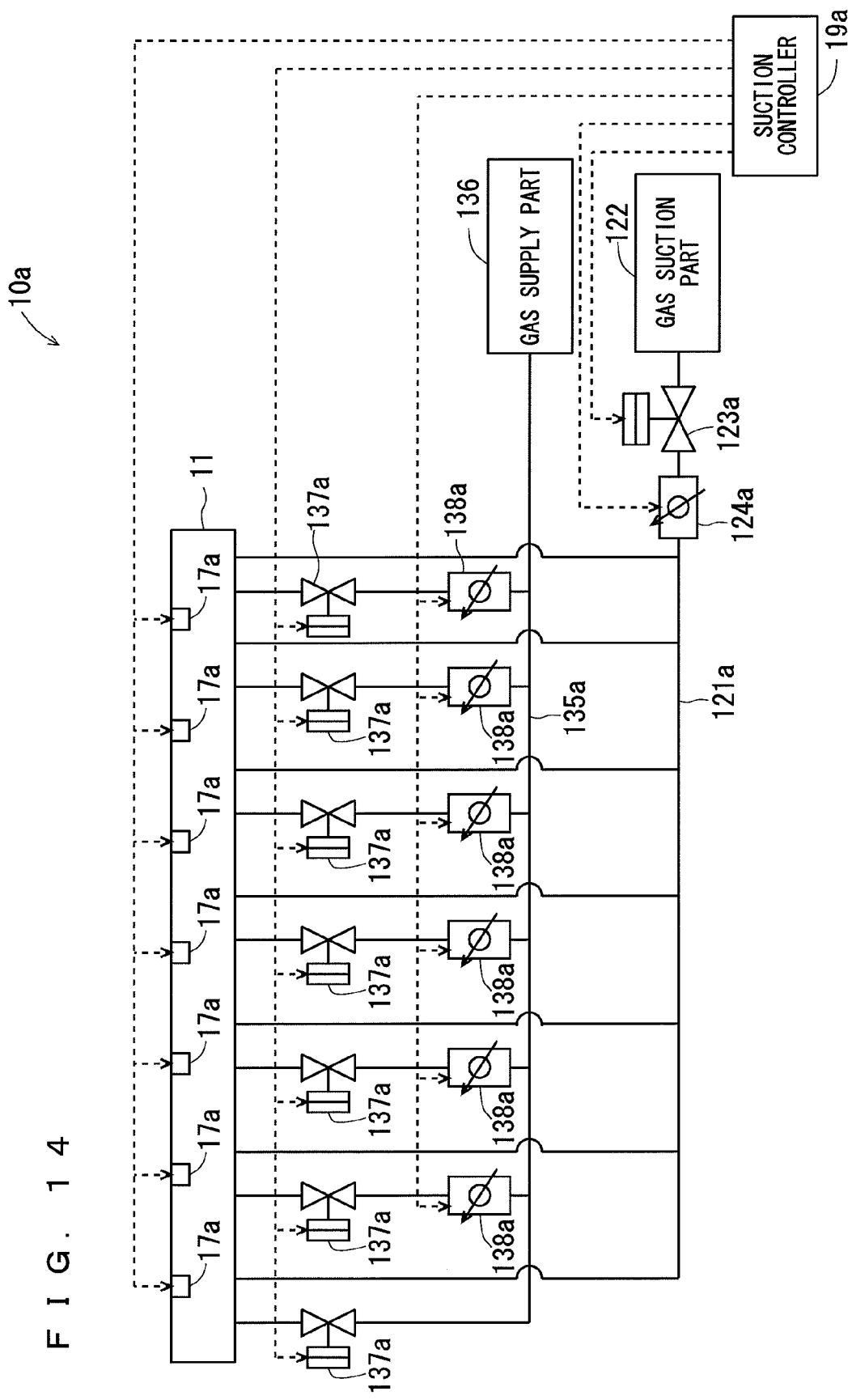
FIG. 14 schematically illustrates a piping system included in the substrate holding part according to a modification of the present invention.

Specifically, for example, in the second preferred embodiment, a flow regulating valve 124a in addition to the on-off valve 123a may be interposed at some midpoint (in the joined portion) of the branch piping 121a connecting the vacuum suction ports 12a and the gas suction part 122 (FIG. 14). In such a configuration, the suction controller 19a electrically connected to the flow regulating valve 124a controls the flow regulating valve 124a to change the amount of suction of the gas in the branch piping 121a to any value. This allows the negative pressure (suction pressure) in the vacuum suction ports 12a to be changed to any value.

Also, for example, flow regulating valves 138a may be interposed at some midpoint (in the branched portions, respectively) of the branch piping 135a connecting the Bernoulli suction units 130 and the gas supply part 136 (FIG. 14). In such a configuration, the suction controller 19a electrically connected to the flow regulating valves 138a controls the flow regulating valves 138a to change the amount of flow of the compressed gas supplied to the Bernoulli suction units 130 to any value. This allows the negative pressure (suction pressure) formed in the Bernoulli suction ports 13a to be changed independently to any value.

In the configuration shown in FIG. 14, for example, the suction controller 19a may acquire information (thickness information) indicative of the thickness of a substrate W to be processed, for example, by accepting the information from an operator through the input part 96 (FIG. 7) (or acquire the information by measuring the thickness of the substrate W placed on the holding surface 111a with an optical sensor or the like disposed near the holding surface 111a), to thereby adjust the values of the negative pressures formed in the suction ports 12a and 13a in accordance with the thickness information.

In this case, for example, when the thickness of the substrate W to be processed is less than a reference value, the suction controller 19a controls the flow regulating valve 124a to make the amount of suction of the gas in the branch piping 121a less than a reference value. Then, the suction pressure formed in the vacuum suction ports 12a becomes a higher pressure than a reference value (i.e., the sucking force of the vacuum suction ports 12a is decreased), whereby the thin substrate W is held under suction safely without breakage. On the other hand, when the thickness of the substrate W to be processed is greater than the reference value, the suction controller 19a controls the flow regulating valve 124a to make the amount of suction of the gas in the branch piping 121a greater than the reference value. Then, the suction pressure formed in the vacuum suction ports 12a becomes a lower pressure than the reference value (i.e., the sucking force of the vacuum suction ports 12a is increased), whereby the thick substrate W is securely held under suction.

Also, when the thickness of the substrate W to be processed is less than the reference value, the suction controller 19a controls the flow regulating valves 138a to make the amount of flow of the compressed gas in the branch piping 135a less than a reference value, in addition to (or in place of) the control of the flow regulating valve 124a. Then, the suction pressure formed in the Bernoulli suction ports 13a becomes a higher pressure than the reference value, whereby the thin substrate W is held under suction safely without breakage. On the other hand, when the thickness of the substrate W to be processed is greater than the reference value, the suction controller 19a controls the flow regulating valves 138a to make the amount of flow of the compressed gas in the branch piping 135a greater than the reference value, in addition to (or in place of) the control of the flow regulating valve 124a. Then, the suction pressure formed in the Bernoulli suction ports 13a becomes a lower pressure than the reference value, whereby the thick substrate W is securely held under suction.

When the substrate W to be processed is very thin, the suction controller 19a may close the on-off valve 123a to stop the suction through the vacuum suction ports 12a, while controlling the flow regulating valves 138a to make the amount of flow of the compressed gas in the branch piping 135a less than the reference value, thereby making the suction pressure formed in the Bernoulli suction ports 13a higher than the reference value. In this case, the substrate W is held on the holding surface 111a under suction only by the negative pressure formed in the Bernoulli suction ports 13a. Thus, the substrate W is held on the holding surface 111a under suction safely without breakage even if the substrate W is very thin.

In the configuration shown in FIG. 14, for example, the suction controller 19a may acquire information (warpage amount information) indicative of the amount of warpage of a substrate W to be processed, for example, by accepting the information from an operator through the input part 96 (FIG. 7) (or acquire the information by measuring the amount of warpage of the substrate W placed on the holding surface 111a with an optical sensor or the like disposed near the holding surface 111a), to thereby adjust the negative pressures formed in the Bernoulli suction ports 13a and the vacuum suction ports 12a in accordance with the warpage amount information in addition to (or in place of) the thickness information.

In this case, for example, when the amount of warpage of the substrate W to be processed is less than a reference value, the suction controller 19a controls the flow regulating valves 138a to make the amount of flow of the compressed gas in the branch piping 135a less than a reference value. When the amount of warpage is small, the substrate W is flattened if the sucking force of the Bernoulli suction ports 13a is relatively weak (i.e., if the negative pressure formed in the Bernoulli suction ports 13a is a higher pressure than the reference value). This configuration allows the substrate W to be securely held on the holding surface 111a under suction while effectively suppressing the amount of air consumption. On the other hand, when the amount of warpage of the substrate W to be processed is greater than the reference value, the suction controller 19a controls the flow regulating valves 138a to make the amount of flow of the compressed gas in the branch piping 135a greater than the reference value. Then, the negative pressure formed in the Bernoulli suction ports 13a becomes a lower pressure than the reference value, whereby the substrate W is held well under suction even when the amount of warpage of the substrate W is large.

In the configuration shown in FIG. 14, for example, the suction controller 19a may acquire information (warpage shape information) indicative of the shape of warpage of the substrate W to be processed, for example, by accepting the information from an operator through the input part 96 (FIG. 7) (or acquire the information by measuring the shape of warpage of the substrate W placed on the holding surface 111a with an optical sensor or the like disposed near the holding surface 111a), to thereby adjust the negative pressures formed in the Bernoulli suction ports 13a and the vacuum suction ports 12a in accordance with the warpage shape information in addition to (or in place of) the thickness information and the warpage amount information.

In this case, for example, when the substrate W to be processed is warped in a convex form, the suction controller 19a controls the flow regulating valves 138a so that the negative pressure formed in the Bernoulli suction port 13a disposed in the circular region M1 is lower than the negative pressure formed in the Bernoulli suction ports 13a disposed in the annular region M2. Then, the substrate W is smoothly flattened by the relatively large sucking force formed in the Bernoulli suction port 13a disposed in the circular region M1. On the other hand, when the substrate W to be processed is warped in a concave form, the suction controller 19a controls the flow regulating valves 138a so that the negative pressure formed in the Bernoulli suction ports 13a disposed in the annular region M2 is lower than the negative pressure formed in the Bernoulli suction port 13a disposed in the circular region M1. Then, the substrate W is smoothly flattened by the relatively large sucking force formed in the Bernoulli suction ports 13a disposed in the annular region M2.

<3. Third Modification>

Figure 15:
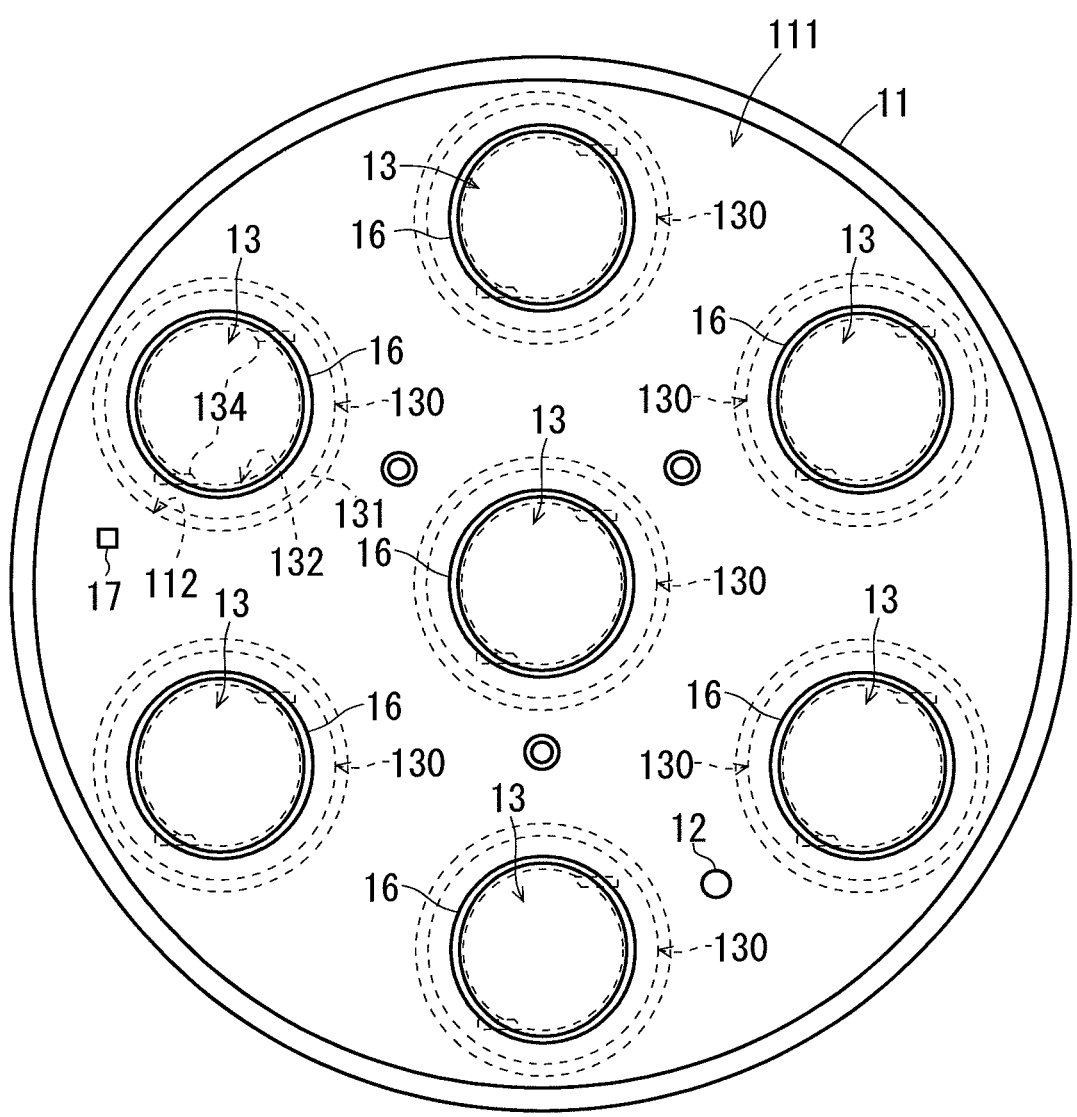
FIG. 15 is a plan view of the substrate holding part according to another modification of the present invention.

In the aforementioned preferred embodiments, the diameter d13 of the Bernoulli suction ports 13 and 13a is less than the diameter d132 of the cylindrical recessed spaces 132 for the purpose of increasing the sucking force. However, the diameter of the Bernoulli suction ports 13 and 13a may be approximately equal to the diameter d132 of the cylindrical recessed spaces 132. FIG. 15 shows the holding surface 111 in the case where the diameter of the Bernoulli suction ports 13 according to the first preferred embodiment is approximately equal to the diameter d132 of the cylindrical recessed spaces 132. In this configuration, the negative pressure formed in the central portion of each of the cylindrical recessed spaces 132 is directly exerted on the holding surfaces 111 and 111a.

<4. Fourth Modification>

In the aforementioned preferred embodiments, the suction through the Bernoulli suction ports 13 and 13a is stopped (in Step S45), when it is confirmed that the substrate W is appropriately held on the holding surfaces 111 and 111a under suction through the Bernoulli suction ports 13 and 13a (YES in Step S44). However, the suction through the Bernoulli suction ports 13 and 13a may be continued after it is confirmed that the substrate W is held on the holding surfaces 111 and 111a under suction. As mentioned above, stopping the suction through the Bernoulli suction ports 13 and 13a at an early stage suppresses the amount of air consumption, and also decreases the danger that the substrate W on the holding surfaces 111 and 111a is contaminated. It is therefore preferable to stop the suction through the Bernoulli suction ports 13 and 13a as early as possible.

<5. Fifth Modification>

The inside diameter of the annular region M2 is equal to the outside diameter of the circular region M1 according to the aforementioned preferred embodiments. However, the inside diameter of the annular region M2 may be greater than the outside diameter of the circular region M1.

The single annular region M2 is defined on each of the holding surfaces 111 and 111a according to the aforementioned preferred embodiments. However, the annular region M2 may be divided into a plurality of annular sub-regions, so that the Bernoulli suction ports are arranged in equally spaced relation in a circumferential direction of each of the annular sub-regions.

<6. Sixth Modification>

When it is judged that a suction failure occurs according to the second preferred embodiment, the suction controller 19a controls the opening and closing of the on-off valves 137a so as to select the Bernoulli suction ports 13a one at a time (or at least two at a time) in succession to form a negative pressure only in the at least one selected Bernoulli suction port 13a (with reference to FIG. 13, for example). However, when it is judged that a suction failure occurs, the suction controller 19a may open all of the on-off valves 137a to form a negative pressure in all of the Bernoulli suction ports 13a. In this case, a single on-off valve 137a may be provided in the joined portion of the branch piping 135a, rather than the on-off valves 137a provided respectively in the branched portions of the branch piping 135a.

<7. Seventh Modification>

In the second preferred embodiment, the on-off valve 123a is interposed in the joined portion of the branch piping 121a connecting the vacuum suction ports 12a and the gas suction part 122. However, on-off valves may be interposed in the branched portions, respectively, of the branch piping 121a, so that the suction controller 19a independently controls the opening and closing of the on-off valves. This configuration allows the negative pressure to be formed independently in the vacuum suction ports 12a. In this configuration, the suction controller 19a may control the opening and closing of the on-off valves so as to select the vacuum suction ports 12a one at a time (or at least two at a time) in succession to form a negative pressure only in the at least one selected vacuum suction port 12a.

<8. Other Modifications>

In the aforementioned preferred embodiments, the GLV that is a spatial light modulator of a diffraction grating type in which for example fixed and movable ribbons serving as units for modulation are disposed one-dimensionally is used as the spatial light modulator 441. The present invention, however, is not limited to this. For example, the GLV need not be used, but a spatial light modulator in which units for modulation such as mirrors are arranged one-dimensionally may be used. Alternatively, for example, a spatial light modulator in which micromirrors each serving as a unit for modulation such as a DMD (digital micromirror device) are arranged two-dimensionally may be used.

In the aforementioned preferred embodiments, the substrate holding parts 10 and 10a are incorporated in the drawing apparatus 1 which directs light onto a substrate W to form a pattern on the substrate W. However, the substrate holding parts 10 and 10a may be incorporated in a variety of substrate processing apparatuses other than the drawing apparatus 1, substrate transport apparatuses, and the like.

While the invention has been described in detail, the foregoing description is in all aspects illustrative and not restrictive. It is understood that numerous other modifications and variations can be devised without departing from the scope of the invention.

What is claimed is:

1. A substrate processing apparatus for performing a predetermined process on a substrate, comprising:
    a holding plate having a holding surface configured to be opposed a back surface of a substrate;
    at least one vacuum suction port formed in said holding surface and configured to attract said substrate to said holding surface by vacuum suction; and
    a plurality of Bernoulli suction ports formed in said holding surface and configured to attract said substrate to said holding surface by Bernoulli suction,
    said holding surface including a circular region disposed concentrically with a center of said holding surface, and an annular region disposed concentrically with said circular region,
    at least one of said Bernoulli suction ports being disposed in said circular region,
    at least one of said Bernoulli suction ports being disposed in said annular region.

2. The substrate processing apparatus according to claim 1, further comprising:
    an embankment provided upright along an outer edge of said holding surface; and
    a plurality of protrusions provided upright in a region of said holding surface surrounded by said embankment,
    tops of the respective protrusions being flush with a top of said embankment.

3. The substrate processing apparatus according to claim 1, wherein
    at least two of said Bernoulli suction ports are disposed in said annular region, and
    said at least two Bernoulli suction ports disposed in said annular region are arranged in a circumferential direction of said annular region.

4. The substrate processing apparatus according to claim 1, further comprising:
    an embankment provided upright so as to surround each of said circular region and a plurality of arcuate regions defined by dividing said annular region in a circumferential direction of said annular region; and
    a plurality of protrusions provided upright in each of the regions of said holding surface surrounded by said embankment,
    the tops of the respective protrusions being flush with the top of said embankment,
    said at least one vacuum suction port including a plurality of vacuum suction ports,
    at least one of said vacuum suction ports and at least one of said Bernoulli suction ports being disposed in each of said arcuate regions,
    at least one of said vacuum suction ports and at least one of said Bernoulli suction ports being disposed in said circular region.

5. The substrate processing apparatus according to claim 4, wherein
    said arcuate regions are equal in area to each other.

6. The substrate processing apparatus according to claim 1, further comprising
    a pressure sensor for detecting a pressure on said holding surface,
    wherein suction through said at least one vacuum suction port is started after the substrate is placed on said holding surface, and
    wherein suction through said Bernoulli suction ports is started, when said pressure sensor does not detect that a suction pressure on said holding surface becomes a lower pressure than a predetermined value after a lapse of a determined time period since the start of the suction through said at least one vacuum suction port.

7. The substrate processing apparatus according to claim 6, wherein
    the suction through said Bernoulli suction ports is stopped, when said pressure sensor detects that the suction pressure on said holding surface becomes a lower pressure than the predetermined value after the start of the suction through said Bernoulli suction ports.

8. The substrate processing apparatus according to claim 1, further comprising:
- a recess provided in the back surface of said holding plate and communicating with each of said Bernoulli suction ports at a bottom surface as seen in a depth direction; and
- a Bernoulli suction unit disposed inside said recesses,
- said Bernoulli suction unit including
- a body part having a cylindrical recessed space formed therein, said body part being fixedly supported inside said recess, with a slight gap produced between said body part and a bottom and wall surfaces of said recess as seen in the depth direction, and
- an ejection nozzle for ejecting a gas into said cylindrical recessed space to produce a swirl flow in said cylindrical recessed space.

9. The substrate processing apparatus according to claim 8, wherein
- each of said Bernoulli suction ports has a diameter less than the diameter of said cylindrical recessed space.

10. A substrate holding apparatus for holding a substrate, comprising:
- a holding plate having a holding surface configured to be opposed a back surface of a substrate;
- at least one vacuum suction port formed in said holding surface and configured to attract said substrate to said holding surface by vacuum suction; and
- a plurality of Bernoulli suction ports formed in said holding surface and configured to attract said substrate to said holding surface by Bernoulli suction,
- said holding surface including a circular region disposed concentrically with a center of said holding surface, and an annular region disposed concentrically with said circular region,
- at least one of said Bernoulli suction ports being disposed in said circular region,
- at least one of said Bernoulli suction ports being disposed in said annular region.

11. The substrate holding apparatus according to claim 10, further comprising:
- an embankment provided upright along an outer edge of said holding surface; and
- a plurality of protrusions provided upright in a region of said holding surface surrounded by said embankment, tops of the respective protrusions being flush with a top of said embankment.

12. The substrate holding apparatus according to claim 10, wherein
- at least two of said Bernoulli suction ports are disposed in said annular region, and
- said at least two Bernoulli suction ports disposed in said annular region are arranged in a circumferential direction of said annular region.

13. The substrate holding apparatus according to claim 10, further comprising:
- an embankment provided upright so as to surround each of said circular region and a plurality of arcuate regions defined by dividing said annular region in a circumferential direction of said annular region; and
- a plurality of protrusions provided upright in each of the regions of said holding surface surrounded by said embankment,
- the tops of the respective protrusions being flush with the top of said embankment,
- said at least one vacuum suction port including a plurality of vacuum suction ports,
- at least one of said vacuum suction ports and at least one of said Bernoulli suction ports being disposed in each of said arcuate regions,
- at least one of said vacuum suction ports and at least one of said Bernoulli suction ports being disposed in said circular region.

14. The substrate holding apparatus according to claim 13, wherein
- said arcuate regions are equal in area to each other.

15. The substrate holding apparatus according to claim 10, further comprising
- a pressure sensor for detecting a pressure on said holding surface,
- wherein suction through said at least one vacuum suction port is started after the substrate is placed on said holding surface, and
- wherein suction through said Bernoulli suction ports is started, when said pressure sensor does not detect that a suction pressure on said holding surface becomes a lower pressure than a predetermined value after a lapse of a determined time period since the start of the suction through said at least one vacuum suction port.

16. The substrate holding apparatus according to claim 15, wherein
- the suction through said Bernoulli suction ports is stopped, when said pressure sensor detects that the suction pressure on said holding surface becomes a lower pressure than the predetermined value after the start of the suction through said Bernoulli suction ports.

17. The substrate holding apparatus according to claim 10, further comprising:
- a recess provided in the back surface of said holding plate and communicating with each of said Bernoulli suction ports at a bottom surface as seen in a depth direction; and
- a Bernoulli suction unit disposed inside said recesses,
- said Bernoulli suction unit including
- a body part having a cylindrical recessed space formed therein, said body part being fixedly supported inside said recess, with a slight gap produced between said body part and a bottom and wall surfaces of said recess as seen in the depth direction, and
- an ejection nozzle for ejecting a gas into said cylindrical recessed space to produce a swirl flow in said cylindrical recessed space.

18. The substrate holding apparatus according to claim 17, wherein
- each of said Bernoulli suction ports has a diameter less than the diameter of said cylindrical recessed space.

19. A method of holding a substrate, comprising the steps of:
- a) placing a substrate on a holding surface formed on a holding plate, with a back surface of said substrate opposed to said holding surface;
- b) forming a suction pressure in at least one vacuum suction port formed in said holding surface by vacuum suction; and
- c) forming a suction pressure in at least one of a plurality of Bernoulli suction ports formed in said holding surface by Bernoulli suction,
- said holding surface including a circular region disposed concentrically with a center of said holding surface, and an annular region disposed concentrically with said circular region,
- at least one of said Bernoulli suction ports being disposed in said circular region,
- at least one of said Bernoulli suction ports being disposed in said annular region.

20. The method according to claim 19, wherein:
an embankment is provided upright along an outer edge of said holding surface;
a plurality of protrusions are provided upright in a region of said holding surface surrounded by said embankment; and
tops of the respective protrusions are flush with a top of said embankment.

21. The method according to claim 19, wherein:
at least two of said Bernoulli suction ports are disposed in said annular region; and
said at least two Bernoulli suction ports disposed in said annular region are arranged in a circumferential direction of said annular region.

22. The method according to claim 19, wherein:
an embankment is provided upright so as to surround each of said circular region and a plurality of arcuate regions defined by dividing said annular region in a circumferential direction of said annular region;
a plurality of protrusions are provided upright in each of the regions of said holding surface surrounded by said embankment;
the tops of the respective protrusions are flush with the top of said embankment;
said at least one vacuum suction port includes a plurality of vacuum suction ports;
at least one of said vacuum suction ports and at least one of said Bernoulli suction ports are disposed in each of said arcuate regions; and
at least one of said vacuum suction ports and at least one of said Bernoulli suction ports are disposed in said circular region.

23. The method according to claim 22, wherein
said arcuate regions are equal in area to each other.

24. The method according to claim 19, wherein:
said step b) is started after the substrate is placed on said holding surface; and
said step c) is started, when a suction pressure on said holding surface does not become a lower pressure than a predetermined value after a lapse of a determined time period since the start of said step b).

25. The method according to claim 24, wherein
said Bernoulli suction is stopped, when the suction pressure on said holding surface becomes a lower pressure than the predetermined value after the start of said step c).

* * * * *